US007684585B2

(12) United States Patent
Kemmerer

(10) Patent No.: US 7,684,585 B2
(45) Date of Patent: Mar. 23, 2010

(54) THERMAL MANAGEMENT SYSTEM FOR SPEAKER SYSTEM HAVING VENTED FRAME FOR ESTABLISHING AIR PASSAGES

(75) Inventor: Jason Kemmerer, Torrance, CA (US)

(73) Assignee: Alpine Electronics, Inc., Tokyo (JP)

( * ) Notice: Subject to any disclaimer, the term of this patent is extended or adjusted under 35 U.S.C. 154(b) by 1078 days.

(21) Appl. No.: 11/343,597

(22) Filed: Jan. 31, 2006

(65) Prior Publication Data

US 2007/0177755 A1 Aug. 2, 2007

(51) Int. Cl.

| | |
|---|---|
| ***H04R 1/00*** | (2006.01) |
| ***H04R 9/06*** | (2006.01) |
| ***H04R 11/02*** | (2006.01) |
| *H05K 7/20* | (2006.01) |

(52) U.S. Cl. ....................................... 381/397; 361/690

(58) Field of Classification Search .................. 381/397
See application file for complete search history.

(56) References Cited

FOREIGN PATENT DOCUMENTS

JP 2000-350287 12/2000

*Primary Examiner*—Curtis Kuntz
*Assistant Examiner*—Matthew Eason
(74) *Attorney, Agent, or Firm*—Muramatsu & Associates

(57) ABSTRACT

A thermal management system improves thermal property of the speaker system by promoting air circulation to cool the speaker system. The thermal management system includes a speaker frame, an air guide formed on the speaker frame for guiding the air, a ventilation slit formed on the air guide which penetrates through the speaker frame for air communication, and a spider mounting ring for mounting a spider of the speaker system on the speaker frame. The spider mounting ring has a cut-out at its upper edge which positionally match the air guide. The cut-out is curved sharply at its upper surface while a lower edge of the spider mounting ring is gently curved, thereby creating an air passage of directional property.

8 Claims, 28 Drawing Sheets

THERMAL MANAGEMENT SYSTEM FOR SPEAKER SYSTEM HAVING VENTED FRAME FOR ESTABLISHING AIR PASSAGES

FILED OF THE INVENTION

This invention relates to a structure of a thermal management system for a speaker system that improves thermal property of the speaker system by promoting air circulation to cool the speaker system, and more particularly, to a structure of a speaker system having a vented frame that establishes air passages of directional property for facilitating the flow of air such that inner heated air around a voice coil is efficiently transferred to a cooler area, thereby efficiently cooling the speaker system.

BACKGROUND OF THE INVENTION

Loudspeakers, or speakers, are well known in the art and are commonly used in a variety of applications, such as in home theater stereo systems, car audio systems, indoor and outdoor concert halls, and the like. A loudspeaker typically includes an acoustic transducer comprised of an electromechanical device which converts an electrical signal into acoustical energy in the form of sound waves and an enclosure for directing the sound waves produced upon application of the electrical signal.

An example of structure in the conventional loudspeaker is shown in FIG. 1. The loudspeaker 11 includes a speaker cone 13 forming a diaphragm 17, a coil bobbin 25, and a dust cap 15. The diaphragm 17, the dust cap 15 and the coil bobbin 25 are attached to one another. The voice coil 27 is attached around the coil bobbin 25. The voice coil 27 is connected to suitable leads (not shown) to receive an electrical input signal through the electrical terminals.

The diaphragm 17 is provided with an upper half roll 21 at its peripheral made of flexible material. The diaphragm 17 connects to the speaker frame 19 at the upper half roll 21 by means of, for example, an adhesive. At about the middle of the speaker frame 19, the intersection of the diaphragm 17 and the coil bobbin 25 is connected to the speaker frame 19 through a spider (inner suspension) 23 made of flexible material. The upper half roll 21 and the spider 23 allow the flexible vertical movements of the diaphragm 17 as well as limit or damp the amplitudes (movable distance in an axial direction) of the diaphragm 17 when it is vibrated in response to the electrical input signal.

An air gap 41 and annular members including a pole piece 37, a permanent magnet 33, and an upper (top) plate 35 make up a magnetic assembly. In this example, the pole piece 37 has a back plate 38 integrally formed at its bottom. The pole piece 37 has a central opening 40 formed by a pole portion 39 for dissipating heat generated by the voice coil 27. The permanent magnet 33 is disposed between the upper plate 35 and the back plate 38 of the pole piece 37. The upper plate 35 and the pole piece 37 are constructed from a material capable of carrying magnetic flux, such as steel. Therefore, a magnetic path is created through the pole piece 37, the upper plate 35, the permanent magnet 33 and the back plate 38 through which the magnetic flux runs.

The air gap 41 is created between the pole piece 37 and the upper plate 35 in which the voice coil 27 and the coil bobbin 25 are inserted in the manner shown in FIG. 1. Thus, when the electrical input signal is applied to the voice coil 27, the current flowing in the voice coil 27 and the magnetic flux (flux density) interact with one another. This interaction produces a force on the voice coil 27 which is proportional to the product of the current and the flux density. This force activates the reciprocal movement of the voice coil 27 on the coil bobbin 25, which vibrates the diaphragm 17, thereby producing the sound waves.

For a loudspeaker described above, heat within the loudspeaker and distortion of sound can be problematic. The voice coil is constructed of a conductive material having electrical resistance. As a consequence, when an electrical signal is supplied to the voice coil, the electric current flowing through the coil generates heat because of the interaction with the resistance. Therefore, the temperature within the loudspeaker and its enclosure will increase. A substantial portion of the electrical input power is converted into heat rather than into acoustic energy.

Such temperature rise in the voice coil creates various disadvantages. As an example of disadvantage, it has been found that significant temperature rise increases the resistance of the voice coil. This, in turn, results in a substantial portion of the input power of the loudspeaker to be converted to the heat, thereby lowering the efficiency and performance of the loudspeaker. In particular, it has been found that increased resistance of the voice coil in the loudspeaker can lead to non-linear loudness compression effects at high sound levels.

When additional power is supplied to compensate for the increased resistance, additional heat is produced, again causes an increase in the resistance of the voice coil. At some point, any additional power input will be converted mostly into heat rather than acoustic output. Further, significant temperature rise can melt bonding materials in the voice coil or overheat the voice coil, resulting in permanent structural damage to the loudspeaker.

Moreover, in the audio sound reproduction involving such a loudspeaker, it is required that the loudspeaker is capable of producing a high output power with low distortion in the sound waves. Low distortion translates to accurate reproduction of sound from the speaker. It is known in the art that a loudspeaker is more nonlinear and generates more distortion in lower frequencies which require large displacement of the diaphragm.

Thus, there is a need for a thermal management system for a loudspeaker that can dissipate heat efficiently while minimizing distortion of sound at the same time.

SUMMARY OF THE INVENTION

It is, therefore, an object of the present invention to provide a thermal management system for a speaker system for effectively controlling an inner temperature of the speaker while minimizing distortions of sound.

It is another object of the present invention to provide a thermal management system for a speaker system which facilitates smooth air flow in predetermined directions in the speaker in response to reciprocal movements of the speaker.

In one aspect of the present invention, the thermal management system for a speaker system is comprised of: a speaker frame for mounting a diaphragm of the speaker system at its upper side, and a voice coil and a magnetic circuit of the speaker system at its lower side; an air guide formed on the speaker frame for guiding air, the air guide being oriented generally in a direction between the upper side and the lower side of the speaker frame; a ventilation slit formed on the air guide which penetrates through the speaker frame for air communication; and a spider mounting ring for mounting a spider of the speaker system on the speaker frame, the spider mounting ring having a cut-out at its upper edge which positionally match the air guide when attached to the speaker frame. The cut-out of the spider mounting ring is curved sharply at its upper surface and a lower edge of the spider mounting ring is gently curved in a manner substantially parallel with an inner surface of the air guide, thereby creating an air passage of directional property.

In the thermal management system of the present invention, the air from the lower side of the speaker system flows through the air passage toward the upper side of the speaker system and comes outside of the speaker system through the openings when the diaphragm makes an upward movement.

Further, in the thermal management system of the present invention, the air from the lower side of the speaker system flows through the air passage and comes outside of the speaker system through the ventilation slits on the air guides when the diaphragm makes a downward movement.

The upper surface of the cut-out of the spider mounting ring which is sharply curved prohibits the air from the upper side of the speaker system from flowing downwardly through the air passage when the diaphragm makes the downward movement, thereby avoiding interference with the flow of air from the lower side to the outside through the air passage and the ventilation slits.

In another aspect of the present invention, the thermal management system for a speaker system is comprised of: a speaker frame for mounting a diaphragm of the speaker system at its upper side, and a voice coil and a magnetic circuit of the speaker system at its lower side; a heat sink ring having a side heat sink formed on an outer side wall thereof, the heat sink ring being inserted in the speaker frame when assembled; a receptacle formed on the speaker frame for receiving the side heat sink therein when the heat sink ring is inserted in the speaker frame, the receptacle being oriented generally in a direction between the upper side and the lower side of the speaker frame; and a ventilation slit formed on a step created in the receptacle, the ventilation slit penetrating through the speaker frame air communication. The step in the receptacle is tapered with a small angle at its lower side and with a large angle at is upper end, thereby creating an air passage of directional property.

In the thermal management system of the present invention, the air from the lower side of the speaker system flows through the air passage formed in the receptacle toward the upper side of the speaker system as well as flows toward the outside of the speaker system through the ventilation slits when the diaphragm makes an upward movement .

Further, in the thermal management system of the present invention, the air from the lower side of the speaker system flows through the air passage and comes outside of the speaker system through the ventilation slits in the receptacles when the diaphragm makes a downward movement.

The upper side of the step which is tapered with the large angle prohibits the air from the upper side of the speaker system from flowing downwardly through the air passage when the diaphragm makes the downward movement, thereby avoiding interference with the flow of air from the lower side to the outside through the air passage and the ventilation slits.

According to the present invention, the thermal management system is configured to effectively control the directions of air flow so that the heated inner air can be smoothly transferred to a cooler area of the speaker or outside of the speaker. The thermal management system facilitates smooth and efficient air flows in the predetermined directions in response to the reciprocal movements of the speaker diaphragm. Thus, the thermal management system promotes the cooling effects of the speaker by efficiently circulating the air between the inner area and the outer area of the speaker system while minimizing distortions of sound.

BRIEF DESCRIPTION OF THE DRAWINGS

FIG. 9A is a top view thereof, FIG. 9B is an enlarged perspective view showing a cut-out and a curved surface of the spider mounting ring, and FIG. 9C is a perspective front side view showing the spider mounting ring.

FIG. 11A shows the condition when the diaphragm makes an upward movement, and FIG. 11B shows the condition when the diaphragm makes a downward movement.

FIG. 13A is a top plan view of the heat sink ring, FIG. 13B is a bottom view of the heat sink ring, FIG. 13C is a perspective view showing an overall structure of the heat sink ring, FIGS. 13D and 13E are enlarged perspective views showing a structure of a side heat sink provided on the outer wall of the heat sink ring.

FIG. 14B is a top view of the speaker frame, FIG. 14C is a side view of the speaker frame, FIG. 14D is a bottom perspective view of the speaker frame, FIGS. 14E and 14F are enlarged perspective views showing a structure of the receptacle formed on the frame leg of the speaker frame.

FIG. 15A shows the condition when the diaphragm makes an upward movement and FIG. 15B shows the condition when the diaphragm makes a downward movement.

DETAILED DESCRIPTION OF THE INVENTION

Figure 1:
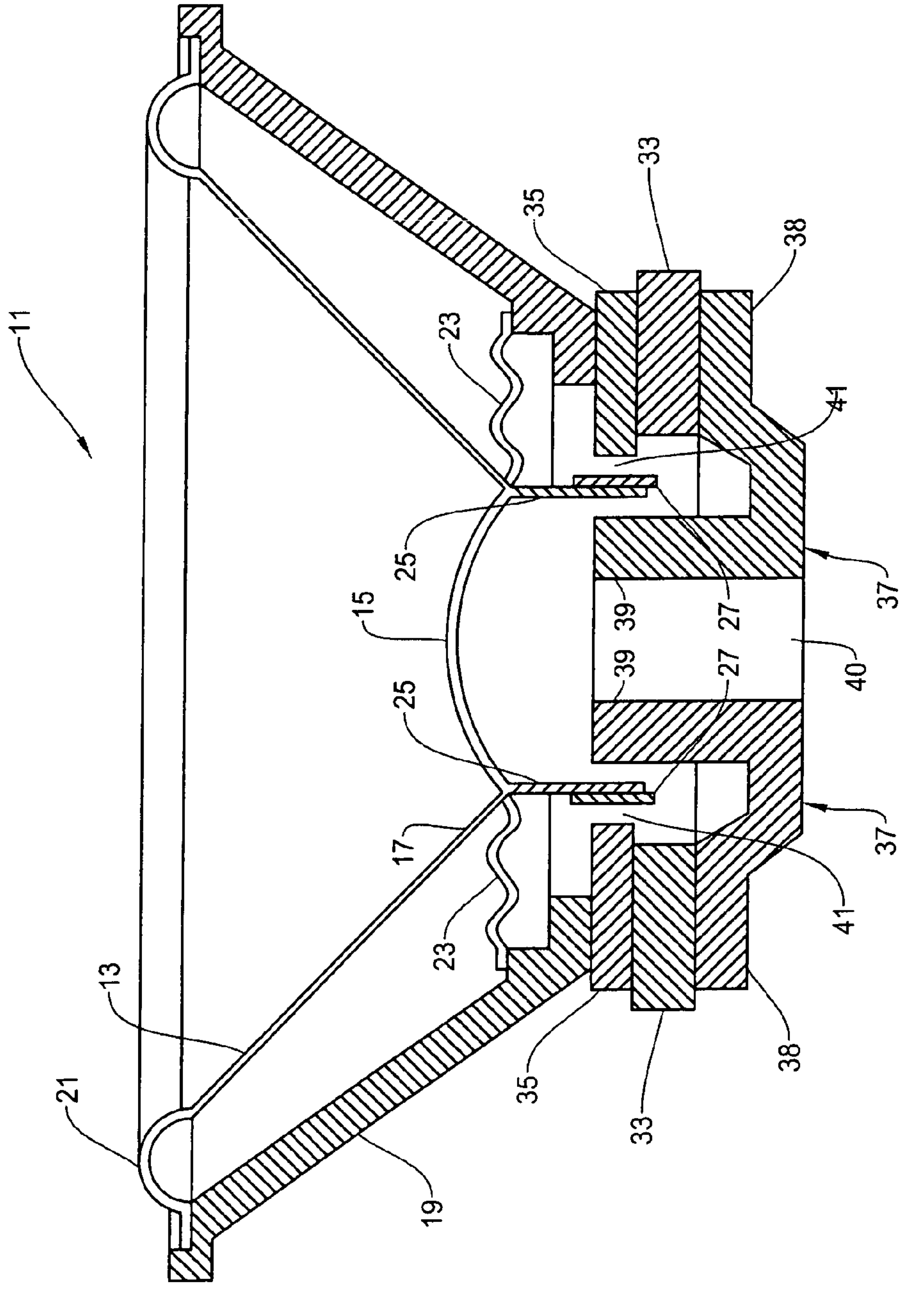
Fig. 1 (Prior Art)
FIG. 1 is a cross sectional view showing an example of inner structure of a loudspeaker in the conventional technology.

The thermal management system of the present invention will be described in more detail with reference to the accompanying drawings. Typically, the thermal management system of the present invention is incorporated in a loudspeaker of an audio system to be installed in an automobile. However, it should be noted that although the present invention is described for the case of implementing it in a loudspeaker for an illustration purpose, it is also possible to apply the present invention to a smaller speaker, or other audio devices.

As noted above, the heat generated by the voice coil causes problems such as increase in the resistance of the voice coil which results in distortions of soundwave and wear and tear of the voice coil. Thus, it is desired that the hot air produced by the voice coil is led to other areas such as the outside so that the hot air does not remain in the area around the voice coil. Further, it is necessary to efficiently introduce the outside cool air toward the inner area of the speaker to cool down the voice coil. The thermal management system of the present invention promotes such cooling operations of the speaker.

The thermal management system in the first embodiment of the present invention is basically configured by a vented frame and a spider mounting ring of a loudspeaker. The vented speaker frame includes one or more ventilation slits provided at predetermined locations of a leg portion of the vented speaker frame. Further, at the leg portion where the ventilation slits are provided, the vented speaker frame has an indented structure to form an air guide.

The spider mounting ring for mounting the spiders is attached to the vented speaker frame to positionally match with the air guide and the ventilation slits at the leg portion of the vented speaker frame. Each leg portion of the vented speaker frame and the spider mounting ring establish an air passage in a manner to guide the air flows to predetermined directions. Such predetermined directions of the air flow are regulated in response to the reciprocal movements of the loudspeaker, thereby promoting air circulation to cool the loudspeaker.

The thermal management system in the second embodiment of the present invention is basically configured by a vented frame having receptacles for receiving side heat sinks formed on a heat sink ring. In the receptacle of the vented speaker frame, there is provided with one or more ventilation slits on a bulge portion. The bulge portion is formed on a protrusion (step) in the receptacle of the vented speaker frame. Further, the receptacle also functions as an air guide because it is configured by side walls.

The heat sink ring is installed in the vented speaker frame in such a way that the side heat sink on the heat sink ring is inserted in corresponding receptacle on the vented speaker frame. Each receptacle of the vented speaker frame and the side heat sink establish an air passage including the ventilation slits in a manner to guide the air flows to predetermined directions in combination with the bulg portion formed on the protrusion. Such predetermined directions of the air flow are regulated in response to the reciprocal movements of the loudspeaker, thereby promoting air circulation to cool the loudspeaker.

Figure 2:
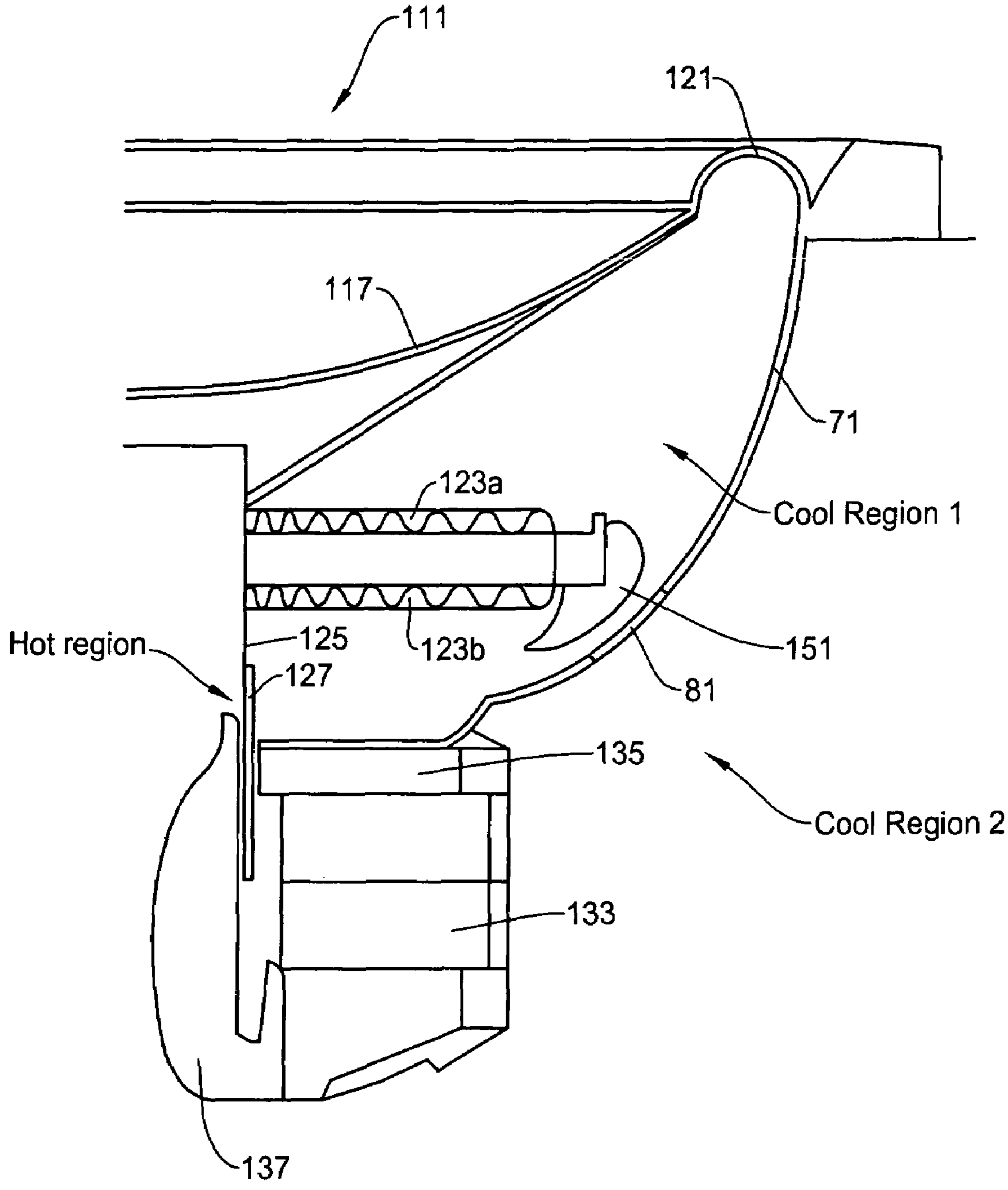
FIG. 2 is a cross sectional view showing a part of a loudspeaker implementing the first embodiment of the thermal management system of the present invention configured by a vented frame with ventilation slit and a spider mounting ring for establishing air passages.

FIGS. 2-11B show the first embodiment of the present invention. FIG. 2 is a cross sectional view of a speaker system 111 such as a loudspeaker implementing the thermal management system of the present invention. The speaker system 111 comprises an upper half roll 121, a diaphragm 117, spiders 123*a* and 123*b*, a vented speaker frame 71, a spider mounting ring 151, ventilation slits 81 formed on a lower part of the vented speaker frame 71, an upper plate 135, a magnet 133, a coil bobbin 125, a voice coil 127, and a pole piece 137. Due to the flow of electric current, the voice coil 127 produces reciprocal (up/down) movement of the diaphragm 117 when the electric current interacts with the magnetic field produced by a magnetic circuit formed by the pole piece, the magnet 133, etc.

Because of the constant flow of electric current, the voice coil 127 and the area around the voice coil 127 are heated. In FIG. 2, the region wherein the heated air generated by the voice coil 127 is concentrated is indicated as a hot region (high temperature region). The region where the air is relatively cool is indicated as cool regions (low temperature regions) 1 and 2. In this example, the cool region 1 is an upper area of the speaker system 111 and the cool region 2 is the outside of the speaker system 111. Thus, it is desired that the hot air in the hot region escapes from the hot region while the cool air from the cool air region is introduced to the hot air region to cool down the hot region and the voice coil 127.

In the present invention, the ventilation slits 81 formed on the vented speaker frame 71 facilitate to exhaust the heated air in the hot region to the outside. Further, in the present invention, air passages formed cut-outs at predetermined locations on the spider mounting ring 151 and the vented speaker frame 71 facilitate to introduce the heated air to the cooler region. The cut-out on the spider mounting ring 151 forming the air passage has a specific curve which allows the air flow in only one direction when the spider mounting ring 151 is mounted on the vented speaker frame 71. In other words, the air passage of directivity (directional property) is created by the thermal management system of the present invention.

Figure 3A:
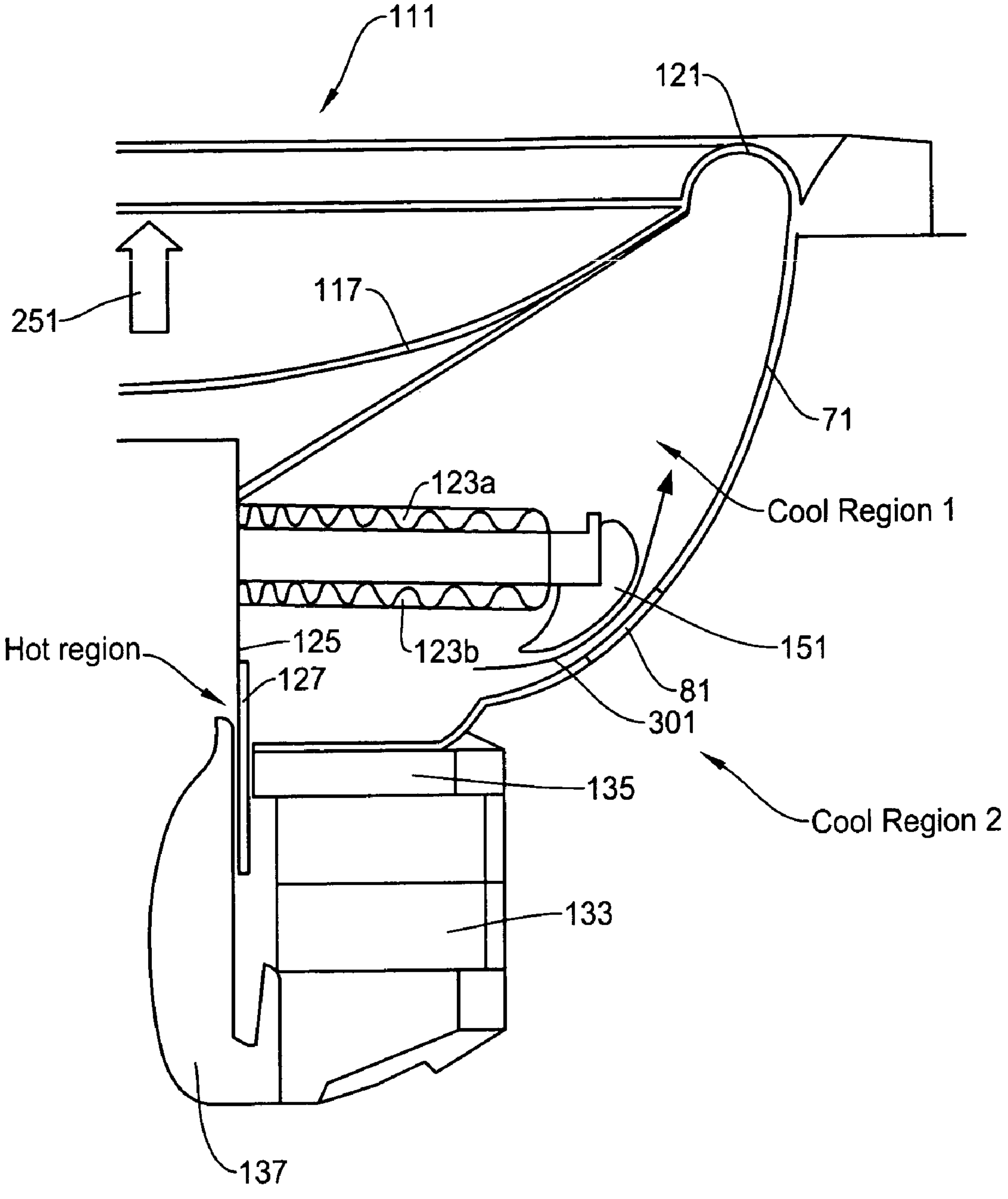
FIGS. 3A and 3B are cross sectional views showing a part of a loudspeaker implementing the thermal management system of the present invention where the diaphragm of the speaker makes an upward movement in FIG. 3A and the diaphragm makes a downward movement motion in FIG. 3B.
Figure 3B:
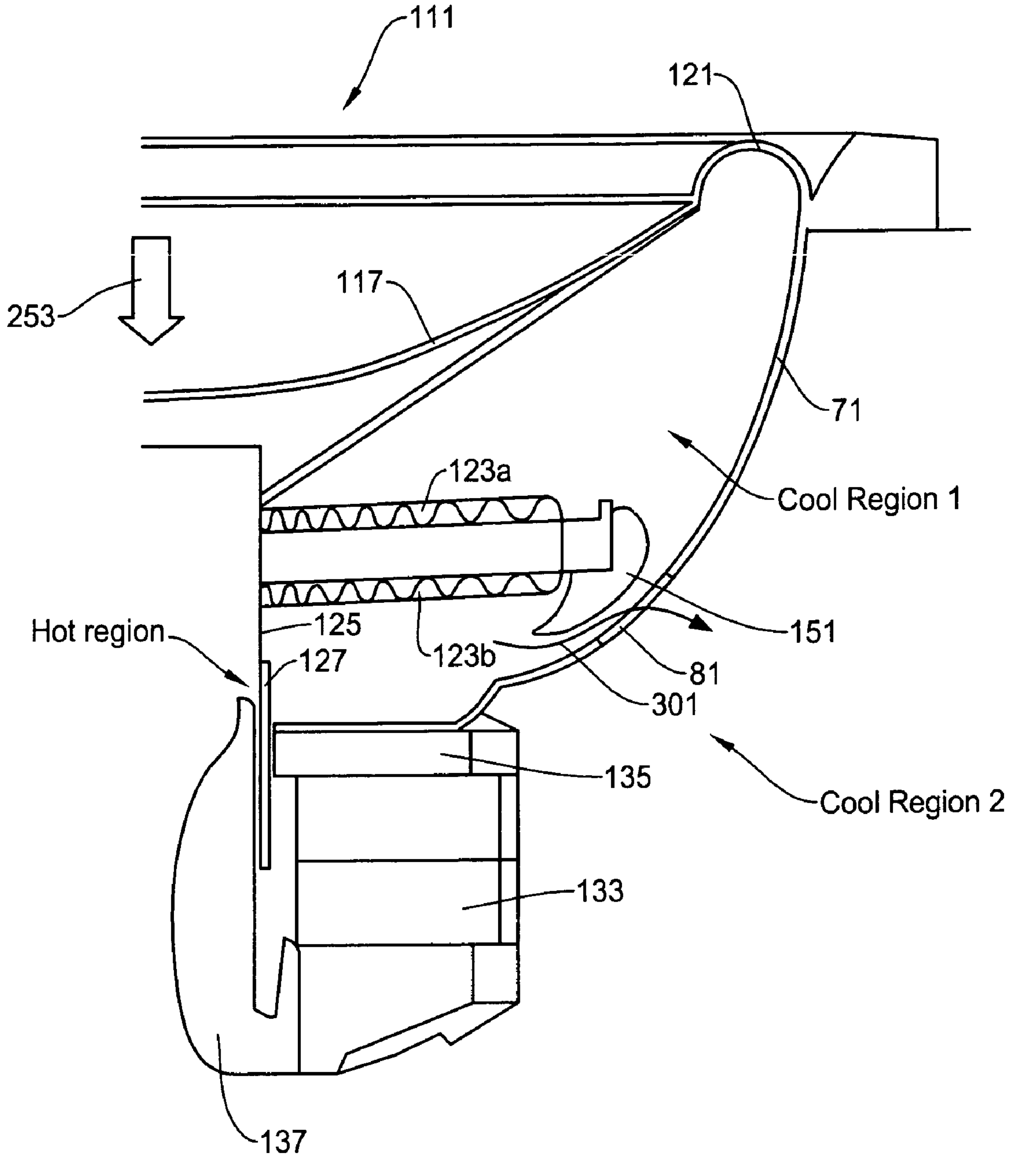

Before going into the detailed structure of the vented speaker frame 71 and the spider mounting ring 151, basic flows of the air in accordance with the thermal management system of the present invention will be described below. FIGS. 3A and 3B show such flows of the air in the speaker system 111 in response to the reciprocal movements of the diaphragm 117 (voice coil 127). FIG. 3A is a cross sectional view of the speaker system 111 implementing the thermal management system of the present invention similar to that shown in FIG. 2 except that the diaphragm 117 is making an upward (outward) movement as indicated by an arrow 251.

In FIG. 3A, because the diaphragm 117 moves upwardly (outwardly), the space of the cool region 1 increases compared to the situation when the diaphragm 117 makes the downward movement. Consequently, the upper region of the speaker system 111 sucks the air from the lower region of the speaker system 111. Thus, in this condition, the air flows from the lower hot region to the upper cool region of the speaker system 111 as indicated by the arrow 301. The air comes to the upper cool region will be eventually exhausted to the outside because an upper portion of the vented speaker frame 71 has several openings 107 (FIGS. 5-8).

FIG. 3B is a cross sectional view of the speaker system 111 similar to the one shown in FIG. 3A but showing the condition where the diaphragm 117 makes a downward (inward) movement as indicated by an arrow 253. The space at the lower region formed by the lower spider 123*b*, the coil bobbin 125, the voice coil 127, and the lower portion of the vented speaker frame 71 decreases compared to the situation where the diaphragm 117 makes the upward movement. In other words, the space in the lower region of the speaker system 111 is compressed by the downward movement of the diaphragm 117. Thus, the heated air in the hot region is exhausted through the ventilation slits 81 as indicated by the arrow 303 toward the cool region (outside) 2.

In this embodiment, the air passage formed between the spider mounting ring 151 and the vented speaker frame 71 is curved so as to direct the air flow smoothly from the hot region to the cool region 1 in FIG. 3A. This is because the lower part of the spider mounting ring 151 is gently curved to run substantially parallel with the inner surface of the vented speaker frame 71. However, since the upper part (cut-out) of the spider mounting ring 151 is abruptly curved, the abrupt curve of upper part prevents the smooth air flow from the cool region 1 toward the hot region in the situation of FIG. 3B. In other words, since the thermal management system of the present invention prohibits the air flow from the cool region 1 to the hot region, the flow of the indicated by the arrow in FIG. 3B is not interfered. Thus, in FIG. 3B, the heated air from the hot region can go out smoothly through the ventilation slits 81.

Figure 4A:
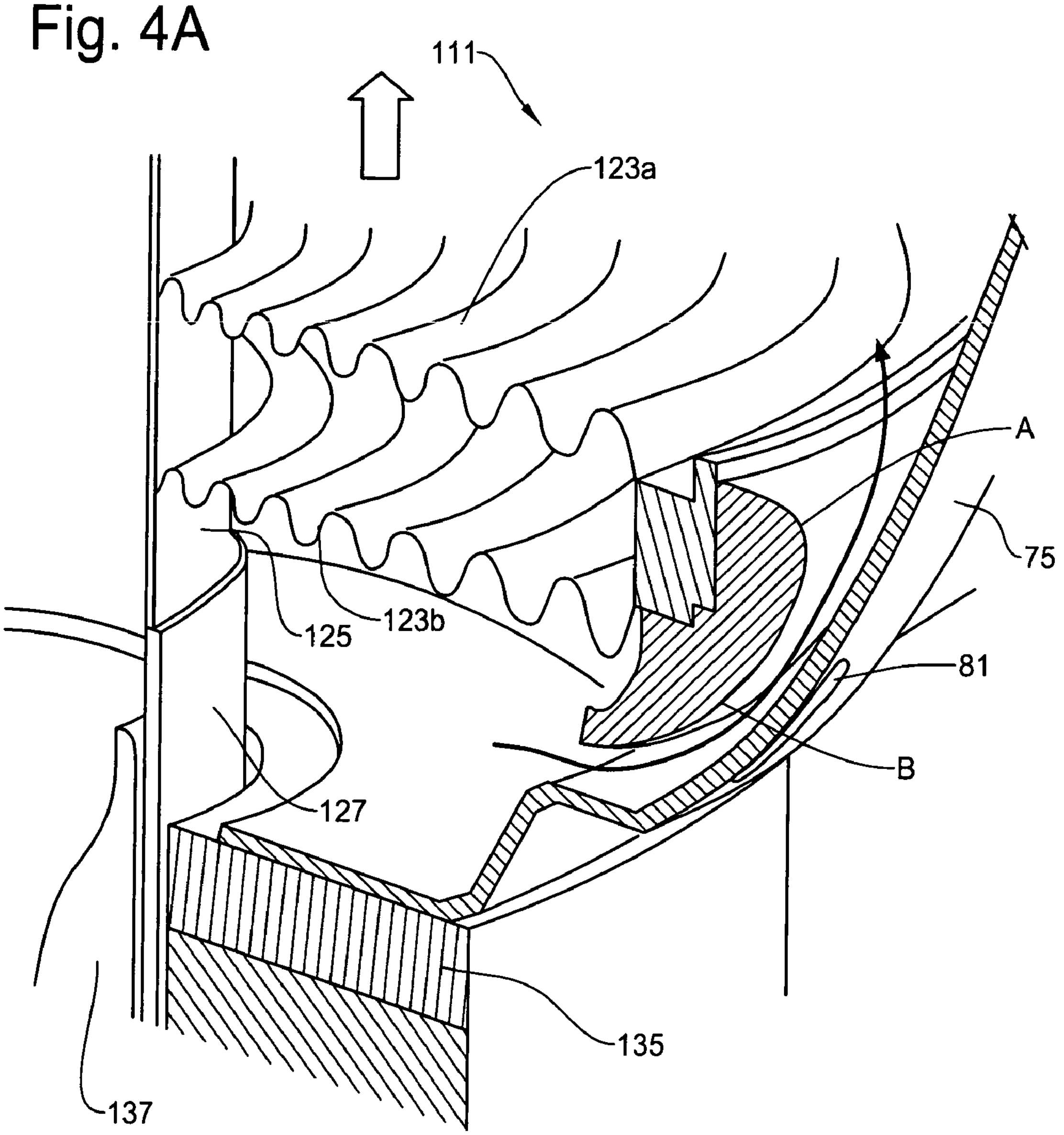
FIGS. 4A and 4B are cross sectional perspective views showing a part of the loudspeaker implementing the thermal management system of the present invention where FIG. 4A corresponds to the condition of FIG. 3A and FIG. 4B corresponds to the condition of FIG. 3B.
Figure 4B:
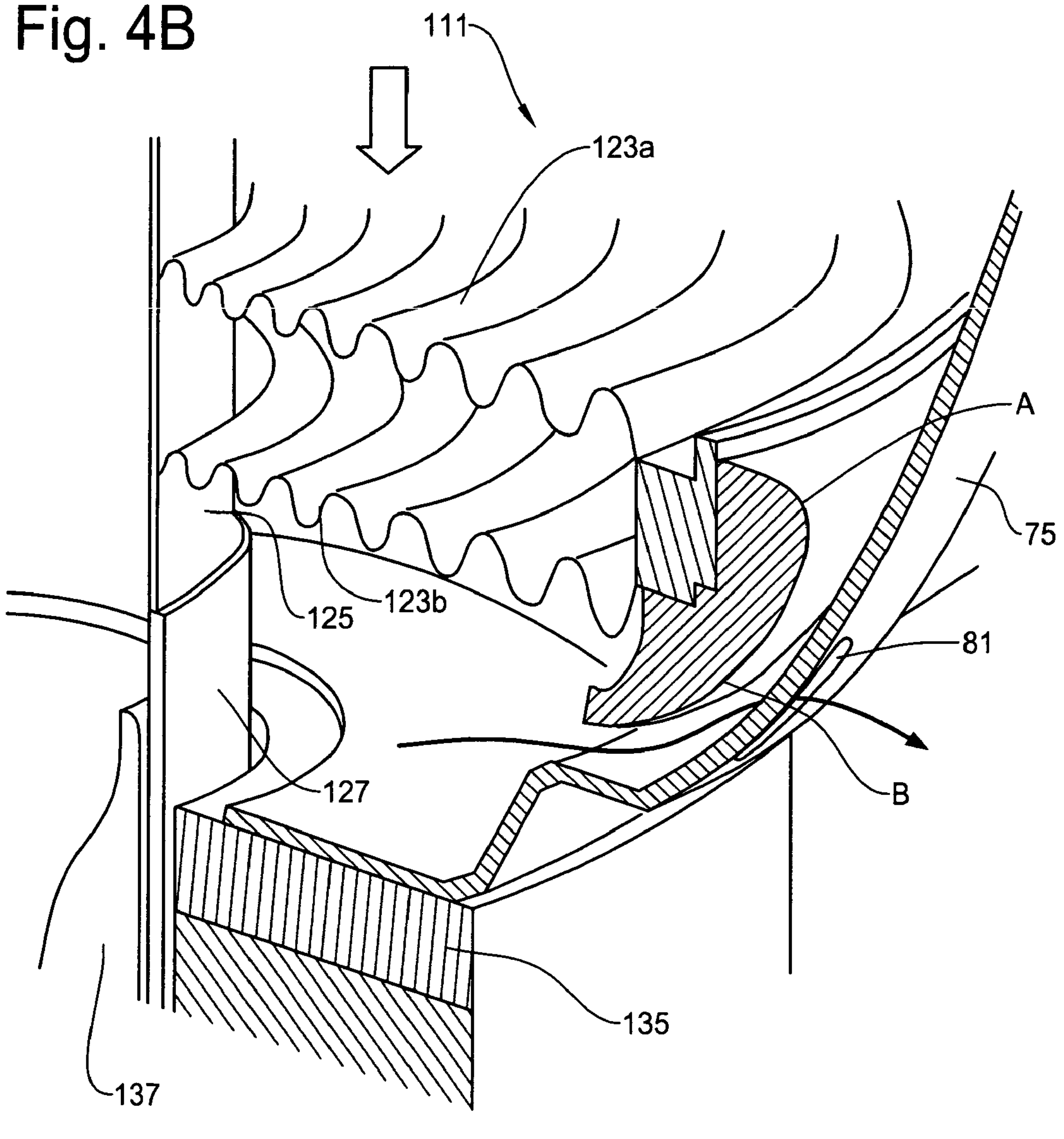

FIG. 4A and 4B are cross sectional perspective views partially showing an inner structure of the speaker system 111 implementing the present invention. The perspective views of FIGS. 4A and 4B correspond to the cross sectional views of FIGS. 3A and 3B, respectively. Namely, FIG. 4A shows the condition where the diaphragm 117 and the voice coil 127 make the upward movement as in the case of FIG. 3A, and FIG. 4B shows the condition where the diaphragm 117 and the voice coil 127 make the downward movement as in the case of FIG. 3B.

The spiders 123*a* and 123*b* are attached to the inner portion of the spider mounting ring (ring portion) 151. The spider mounting ring 151 is fixedly attached to the inside of the vented speaker frame 71 as will be described in detail later. As noted above, the spider mounting ring 151 has a plurality of cut-outs at its outer rim each establishing the air passage in combination with an air guide 77 (FIGS. 6 and 7) formed on the vented speaker frame 71. The cut-outs are positionally matched with the inner surface (air guide 77) of the vented speaker frame 71. Further, the outer surface of the cut-out of the spider mounting ring 151 is abruptly curved at an upper portion as shown by a curve A while gently curved at a side at a lower portion as shown by a curve B. The curve B is substantially parallel with the inner surface of the vented speaker frame 71.

Therefore, in the case of FIG. 4A where the diaphragm 117 and the spiders 123*a* and 123*b* move upward (outward), the heated air around the voice coil 127 (hot region of FIGS. 3A-3B) is attracted by a suction force created by the upward movement. Thus, the heated air moves to the upper area (cool region 1 in FIGS. 3A-3B) of the speaker system 111 through the air passages (including the cut-outs of the spider mounting ring 151) as indicated by the arrow. Since the curve B of the spider mounting ring 151 is gentle, the flow of the air is facilitated in this direction because there is no abrupt change in the direction of the air flows. In other words, there is no resistance against the air flow in this direction of the arrow.

However, since the curve A of the spider mounting ring 151 is abrupt, an air flow in the direction opposite to the arrow is restricted. In other words, there is a large resistance against the reverse air flow because such an air flow needs sharp change in the flow direction. Thus, the heated air is efficiently transferred to the upper region of the speaker system 111 because it is not interfered by the reverse air flow. Since the upper region has relatively cooler temperature, the heated air is cooled in this area. Moreover, since the vented speaker frame 71 typically has several openings 107 (FIGS. 5-8) at the upper portion, the heated air can be exhausted to the outside of the speaker system 111.

In the case of FIG. 4B where the diaphragm 117 and the spiders 123*a* and 123*b* move downward (inward, the space having the heated air around the voice coil 127 (hot region of FIGS. 3A-3B) is compressed. Thus, the heated air moves through the air passages (lower part of the spider mounting ring 151 and the air guide 77) and exhausted to the outside through the ventilation slits 81 as indicated by the arrow. Since the curve B is gentle, the flow of the air is facilitated in this direction because there is no abrupt change in the direction of the air flows. Thus, the heated air is quickly exhausted to the outside through the ventilation slits 81.

During the sound reproduction by the speaker system 111, the above-described processes are repeated. As a result, the heated air is transferred to the upper cool region of the speaker system through the air passages during the upward movement of the speaker system 111, and the heated air is exhausted to the outside through the ventilation slits 81 during the downward movement of the speaker system 111. Although not directly related to the present invention, the cool air from the outside is introduced to the inner area of the speaker system 111 through, for example, a center opening 40 of the pole piece 37 at the bottom thereof shown in FIG. 1.

Figure 5:
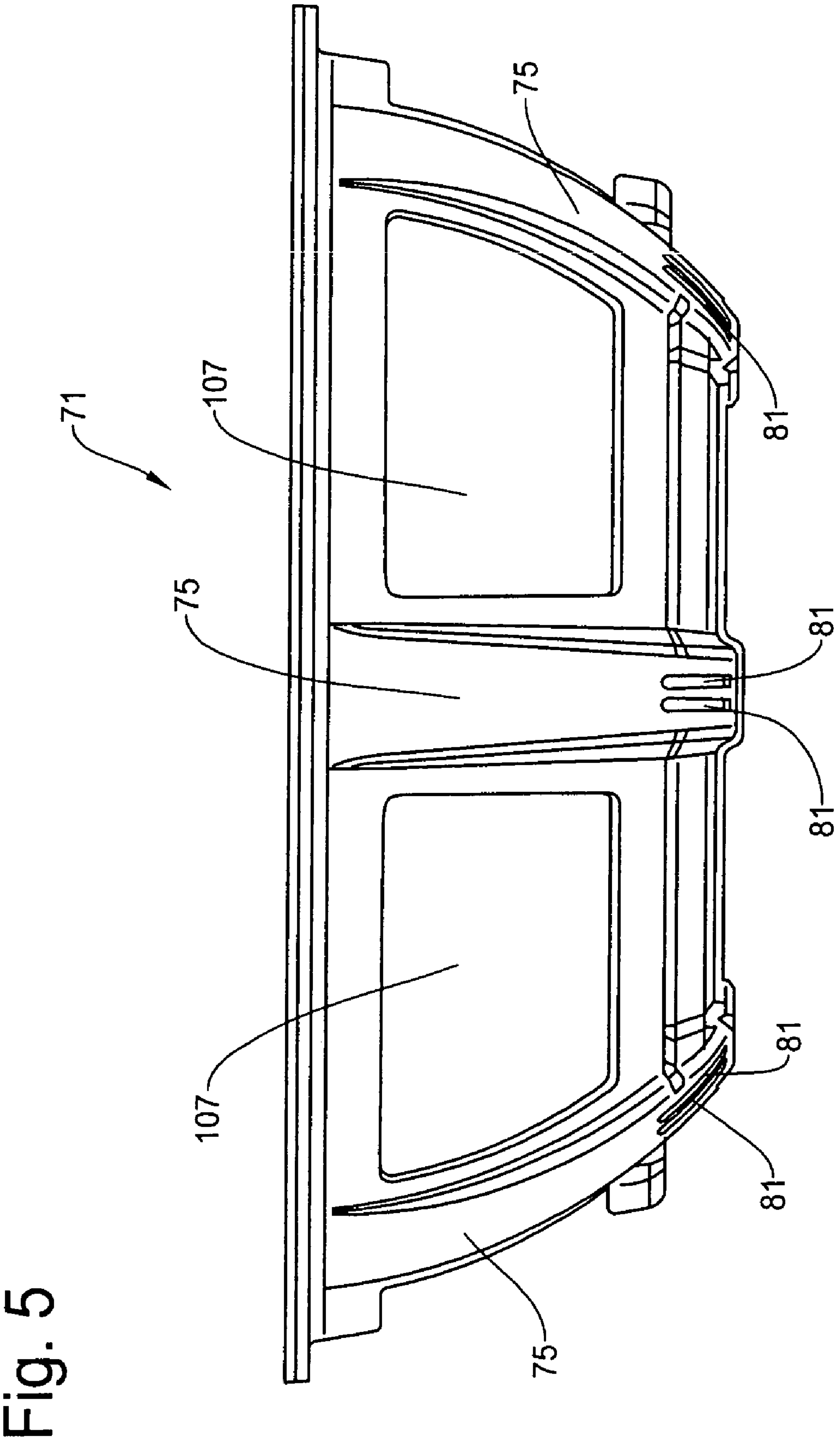
FIG. 5 is a front view showing an outer structure of the speaker frame implementing the thermal management system of the present invention.

Referring now to FIGS. 5 to 8, the structure of the speaker frame incorporated in the first embodiment of the thermal management system of the present invention is explained in detail. FIG. 5 is a front view of the vented speaker frame 71 showing an outer structure thereof including ventilation slits 81. The vented speaker frame 71 has a plurality of speaker legs (leg portions) 75, ventilation slits 81, and openings 107. Each of the speaker leg 75 has an air guide 77 (FIGS. 6 and 7) which forms the air passage at its inner surface in combination with the spider mounting ring 151 as noted above.

Figure 6:
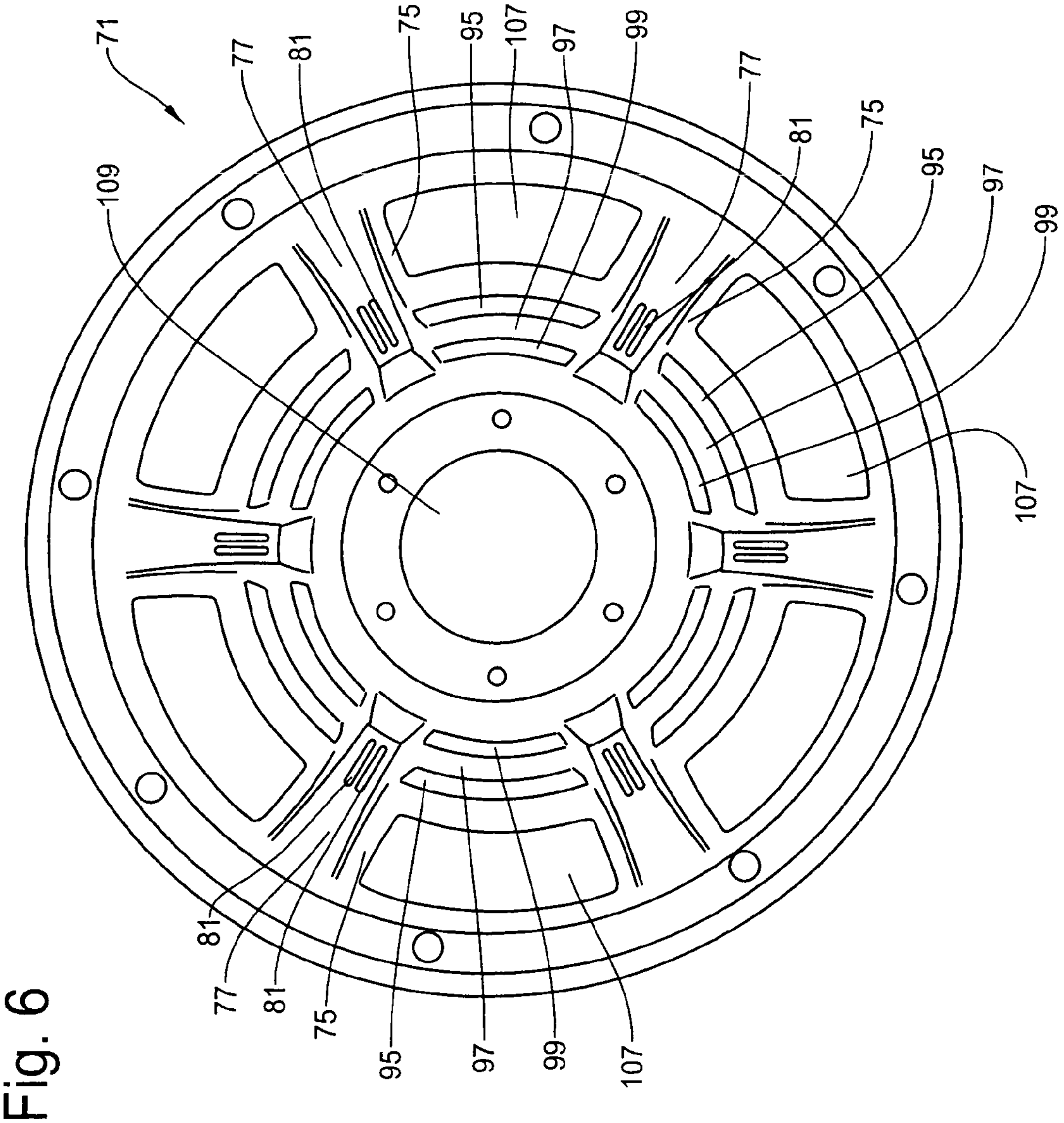
FIG. 6 is a top view showing an inner structure of the speaker frame implementing the thermal management system of the present invention.

FIG. 6 is a top plan view showing the inner structure of the vented speaker frame 71. Each speaker leg 75 has an air guide 77 and the ventilation slits 81. The air guide 77 is indented to act as a guide way for the air, i.e., the air passage noted above in combination with the spider mounting ring 151, as will be described in detail. The surface of the air guide 77 is curved in a manner similar to the curve B on the spider mounting ring 151 (FIGS. 4A and 4B).

Between the adjacent speaker legs 75, a pair of an upper seat 95 and a lower seat 99 is formed onto which the spider mounting ring 151 will be attached. A rim wall 97 is a lightly curved wall of the vented speaker frame 71 that contacts with the spider mounting ring 151 to securely hold the spider mounting ring 151 and the spiders 123*a* and 123*b*. The openings 107 are also formed between the adjacent speaker legs 75 for air circulation.

Figure 7:
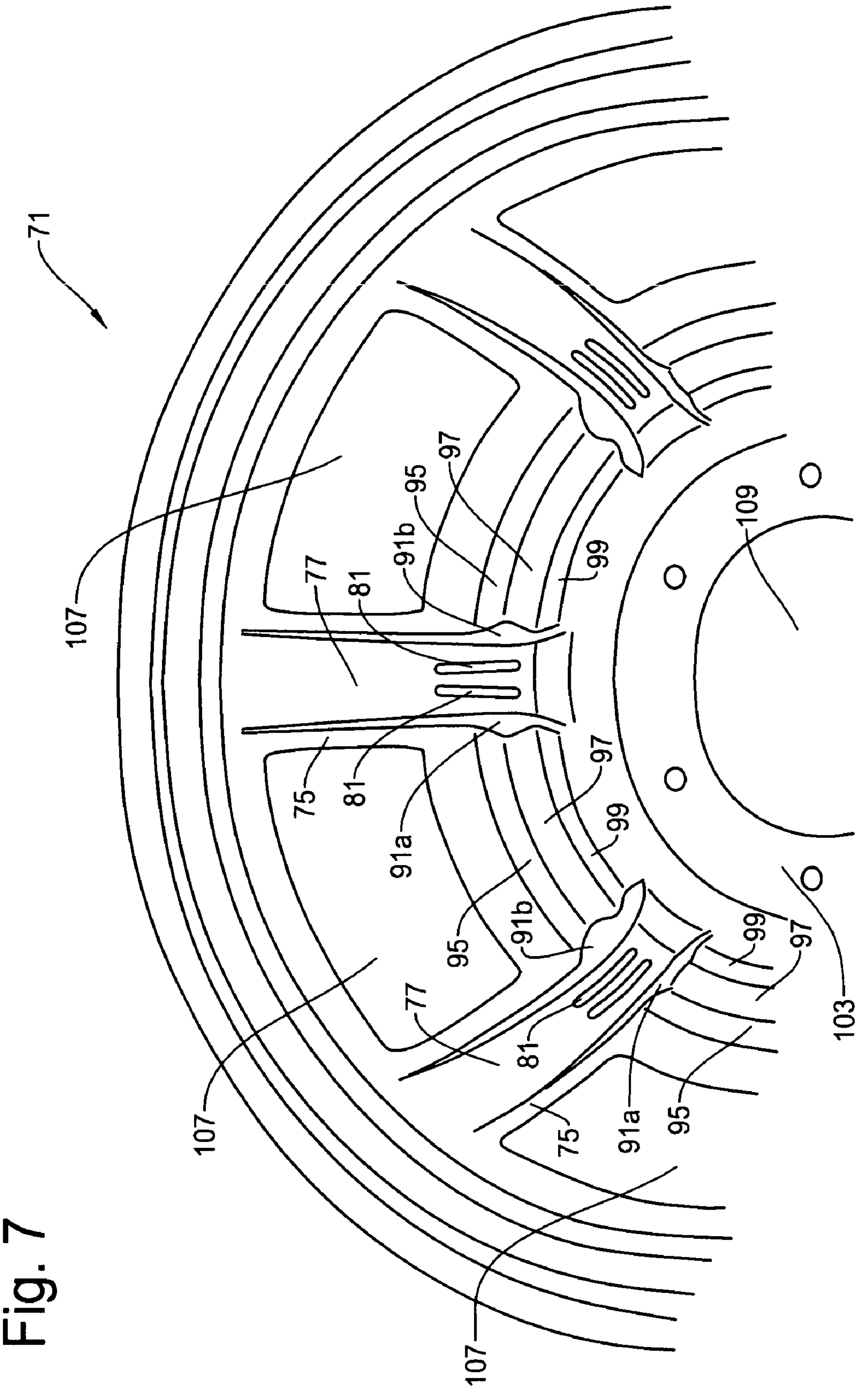
FIG. 7 is a partial perspective view showing an inner structure of the speaker frame implementing the thermal management system of the present invention.
Figure 8:
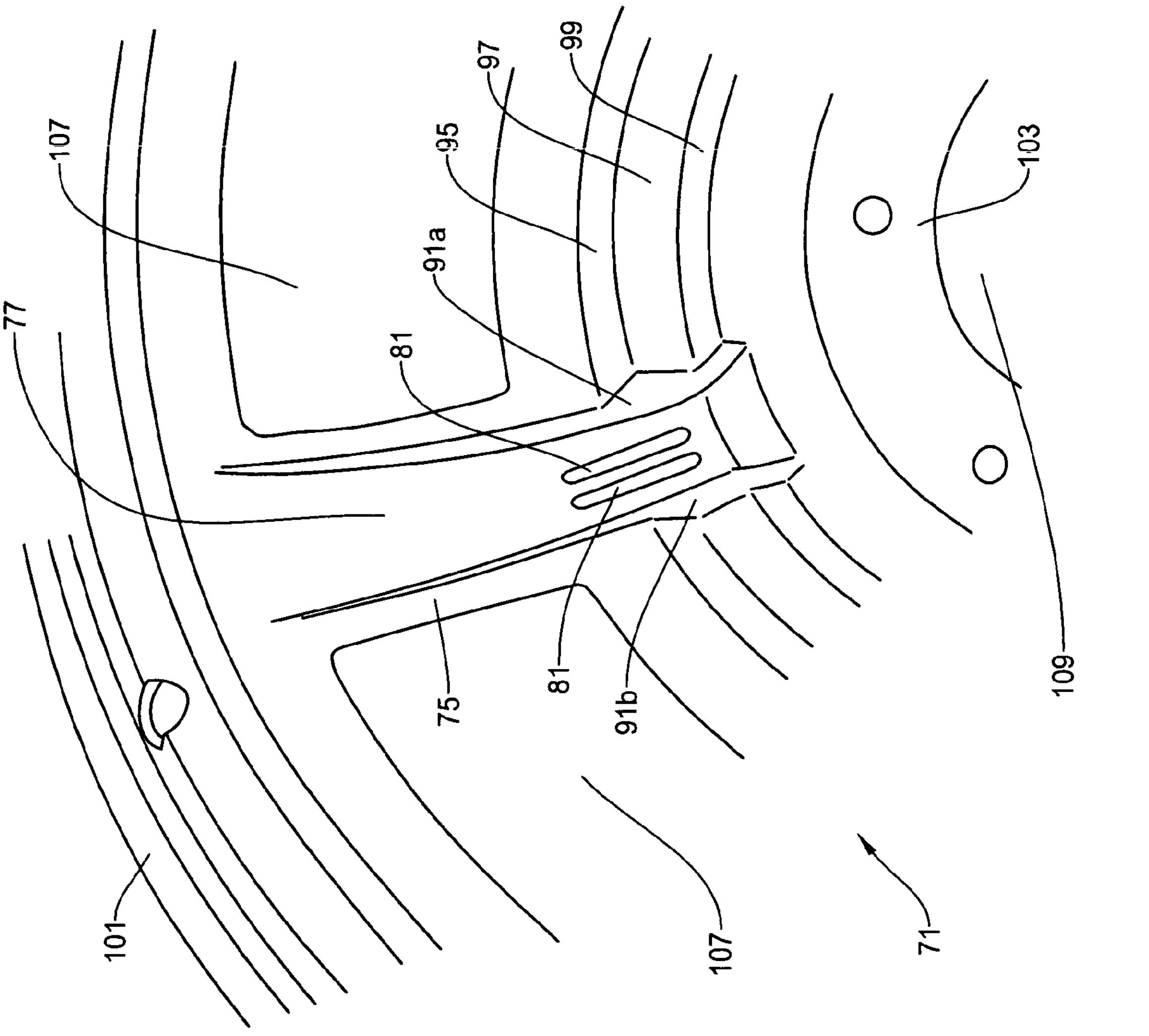
FIG. 8 is a partial perspective view showing an enlarged view of the frame leg of the speaker frame that corresponds to the speaker frame shown in FIG. 7.

FIGS. 7 and 8 are partial perspective views of the vented speaker frame 71 in accordance with the present invention. FIG. 8 provides the enlarged view of the vented speaker frame 71. The air guide 77 is a groove or an indentation formed on the inner surface of the frame leg 75. Thus, the air guide 77 has side walls 91*a* and 91*b* at both sides so that it functions to guide the air along the side walls 91*a* and 91*b*. The ventilation slits 81 are through holes formed at the lower location of each air guide 77. As noted above and will be described with reference to FIG. 10 later, the air guide 77 and the cut-out formed on the spider mounting ring 151 create the air passage which facilitates the smooth air flow in the predetermined direction to cool the speaker system 111.

In FIGS. 7 and 8, the inner surface of the air guide 77 is gently curved which is substantially parallel with the curve B on the lower outer surface of the spider mounting ring 151 (FIGS. 4A and 4B). As will be described below, the upper seat 95, the lower seat 99, and the rim wall 97 are provided to securely attach the spider mounting ring 151 on the vented speaker frame 71 FIGS. 7 and 8 also show a bottom 103 of the speaker frame 71 for mounting the back plate of the pole piece 137 and a center opening 109 of the speaker frame 71 for air circulation.

Figure 9A:
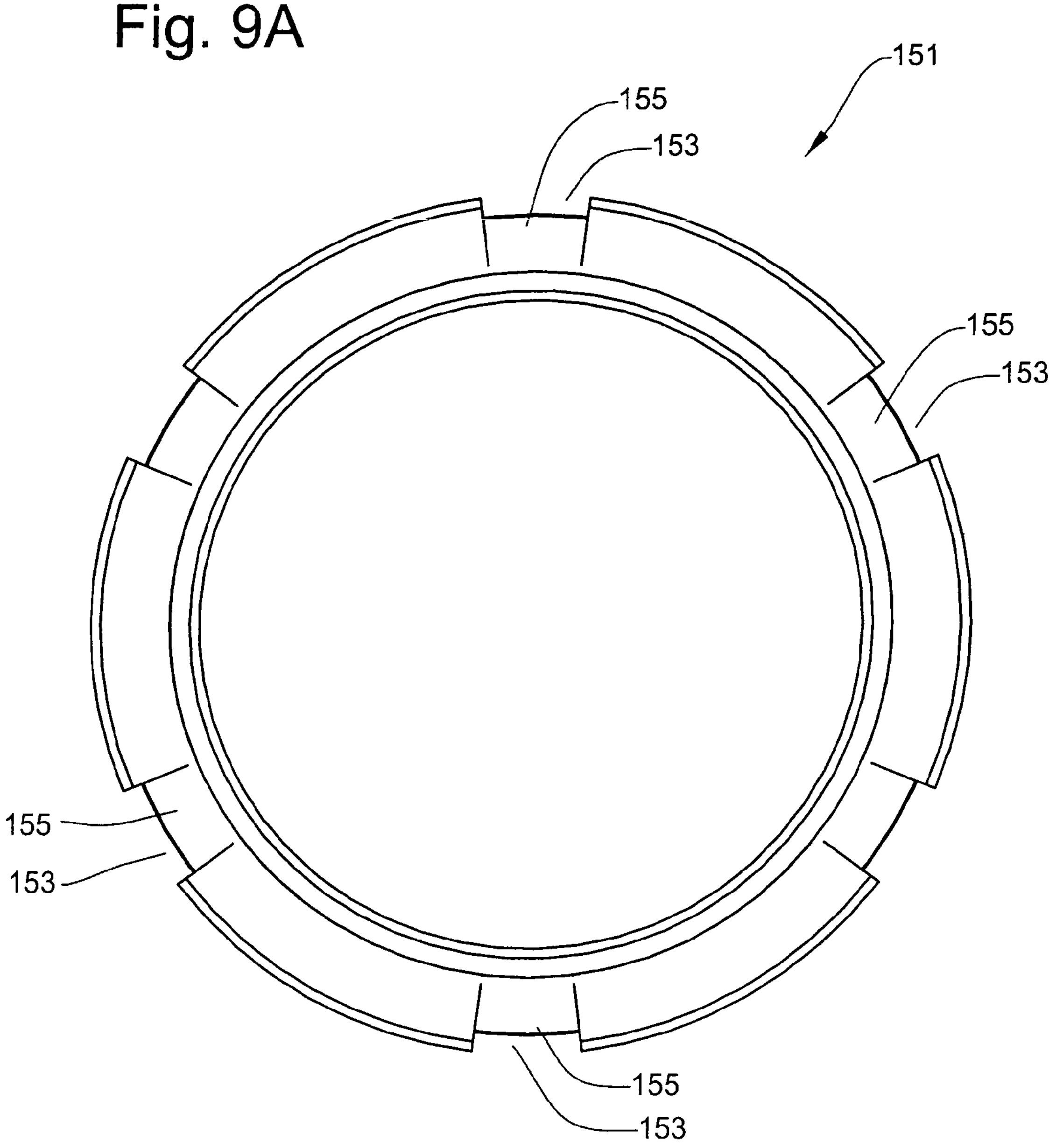
FIGS. 9A-9C show a structure of a spider mounting ring of the loudspeaker implementing the thermal management system of the present invention where

Next, the spider mounting ring 151 of thermal management system in the first embodiment of the present invention will be described in detail. FIG. 9A is a top view of the spider mounting ring 151 for mounting the spiders 123*a* and 123*b* on the vented speaker frame 71. The spider mounting ring 151 is a circular ring and has a plurality of cut-outs 153 at the outer end. In this example, six cut-outs 153 are provided so that each cut-out 153 matches the air guide 77 on the frame leg 75 of the vented speaker frame 71.

When the spider mounting ring 151 is placed on the vented speaker frame 71, the air passage is formed by the cut-out 153 on the spider mounting ring 151 and the air guide 77 on the vented speaker frame 71. The cut-out 153 is partly formed by a curved surface 155, which is the abrupt curve A in the upper part of the cut-out 153 as shown in FIGS. 4A and 4B. The curved surface 155 serves to control the flow direction of the air as described with reference to FIG. 4A by increasing the resistance against the air flow in the undesired direction.

Figure 9B:
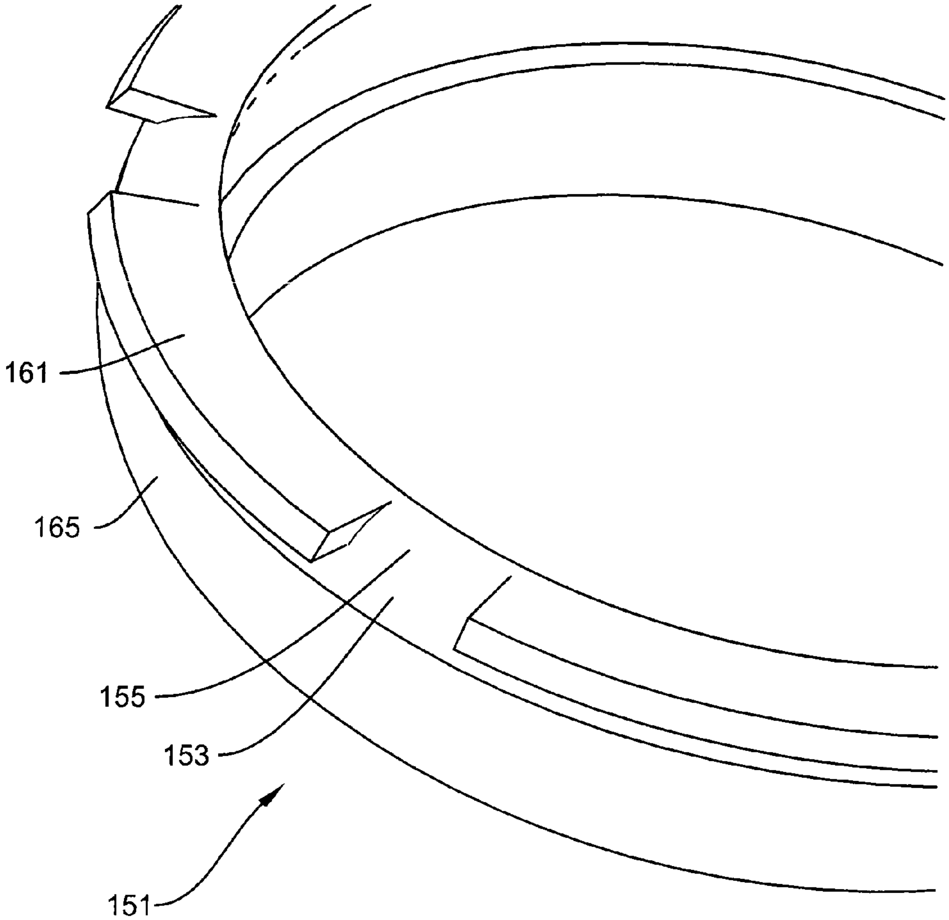
Figure 9C:
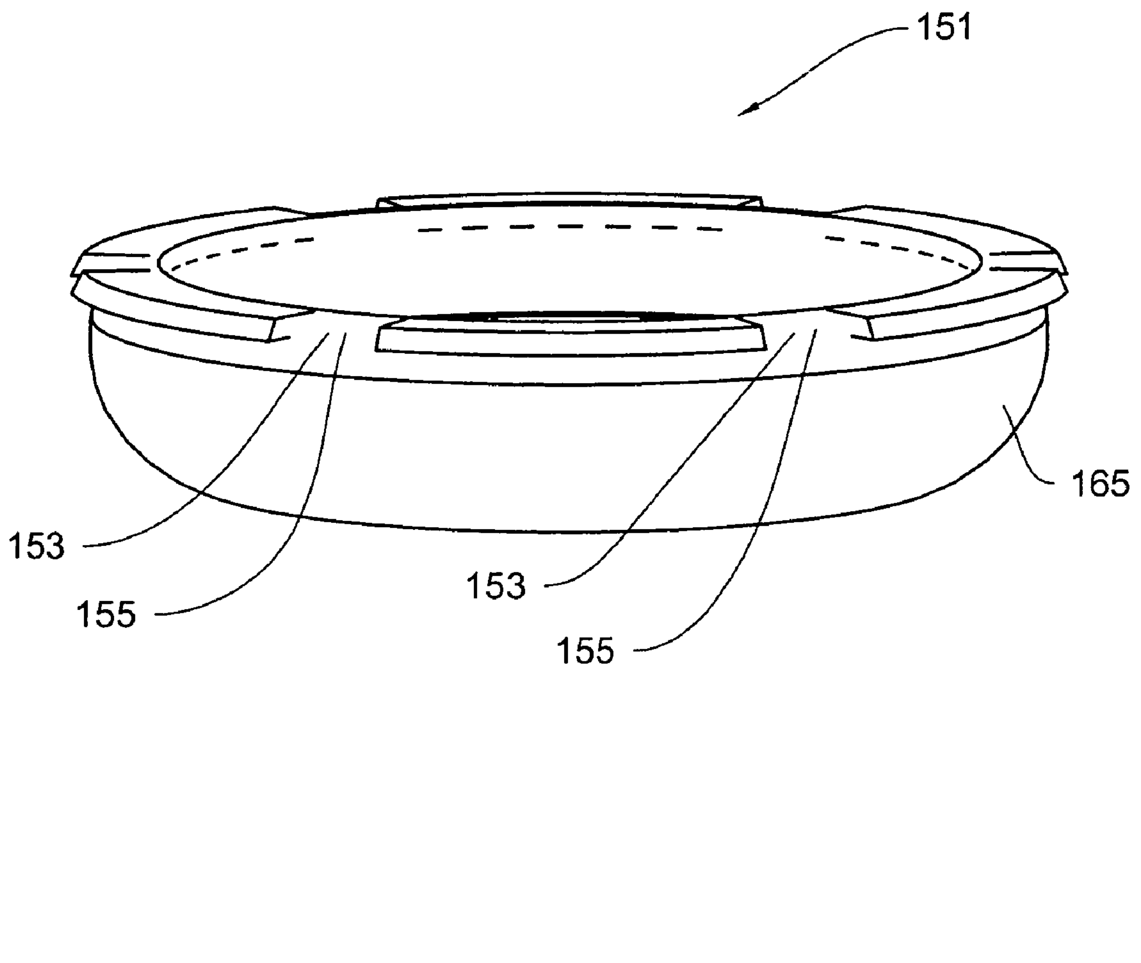

FIG. 9B is a perspective view showing an upper structure of the spider mounting ring 151 which shows an enlarged view of the cut-out 153 and the curved surface 155 of the cut-out 153. FIG. 9C is a perspective view generally showing the front structure of the spider mounting ring 151. The curved surface 155 on the cut-out 153 is abruptly curved (curve A in FIGS. 4A and 4B) and a curved surface 165 on the lower part of the spider mounting ring 151 is gently curved (curve B in FIGS. 4A and 4B). The curved surface 165 contacts the rim wall 97 (FIGS. 6-8) of the vented speaker frame 71. The curved surface 165 that corresponds to the air guide 77 on the frame leg 75 creates the air passage noted above because the air guide 77 is indented by the side walls 91*a* and 91*b*.

Figure 10:
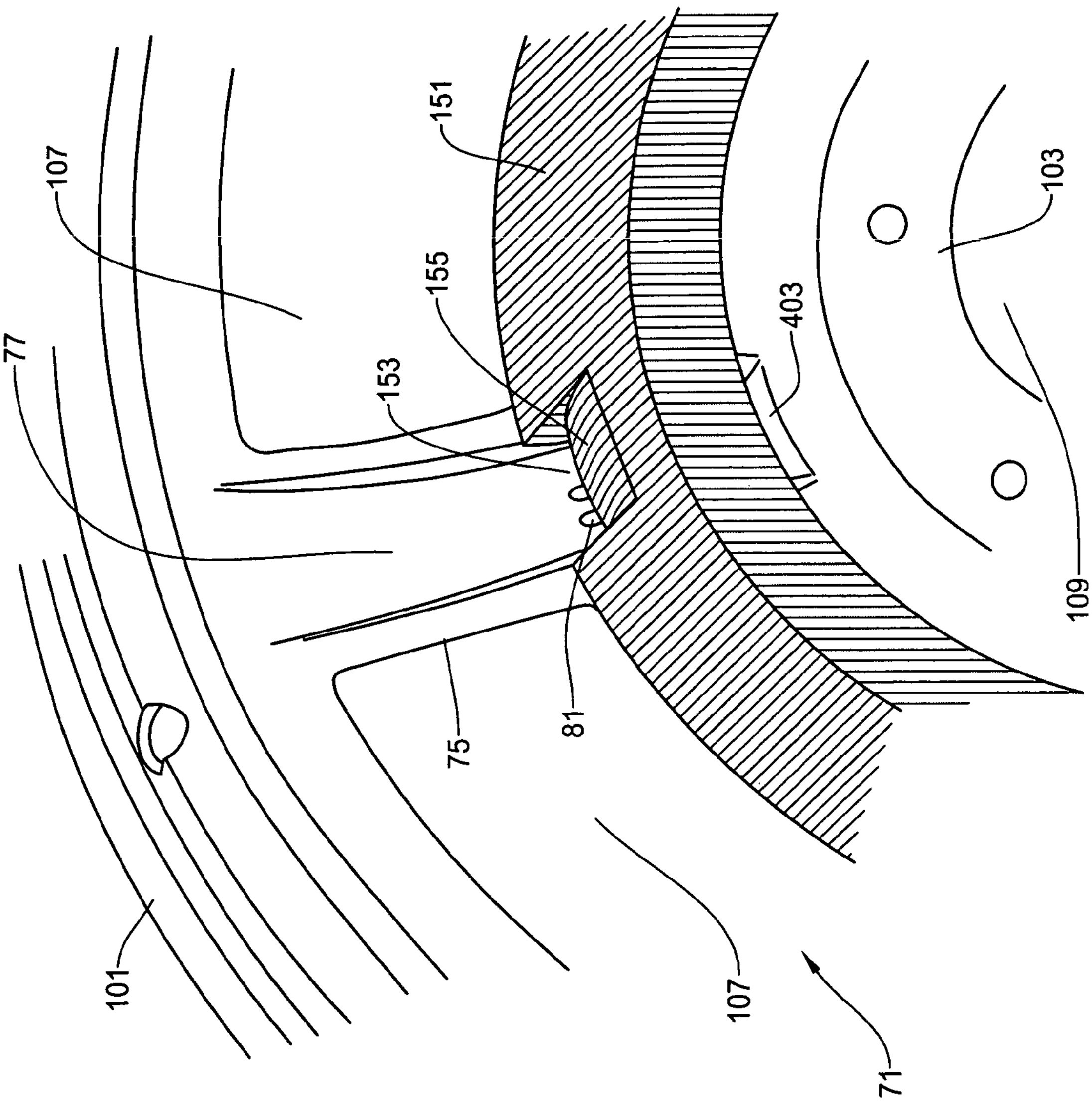
FIG. 10 is a perspective view showing the condition wherein the spider mounting ring is assembled in a manner to match with the speaker frame for implementing the thermal management system of the present invention.

The perspective view of FIG. 10 shows the condition where the spider mounting ring 151 is placed on the vented speaker frame 71. In FIG. 10, the spider 123 that should have been attached to the spider mounting ring 151 in the actual construction is omitted for clearly showing the relationship between the spider mounting ring 151 and the vented speaker frame 71. As shown, the curved surface 155 on the cut-out 153 is positionally matched to the air guide 77 on the frame leg 71 to create the air passage (FIG. 4A). Thus, the air passage from a lower opening 401 to the upper region of the speaker through the air guide 77 as well as the air passage from the lower opening 401 to the outside through the ventilation slits 81 are established by the thermal management system of the present invention.

Figure 11A:
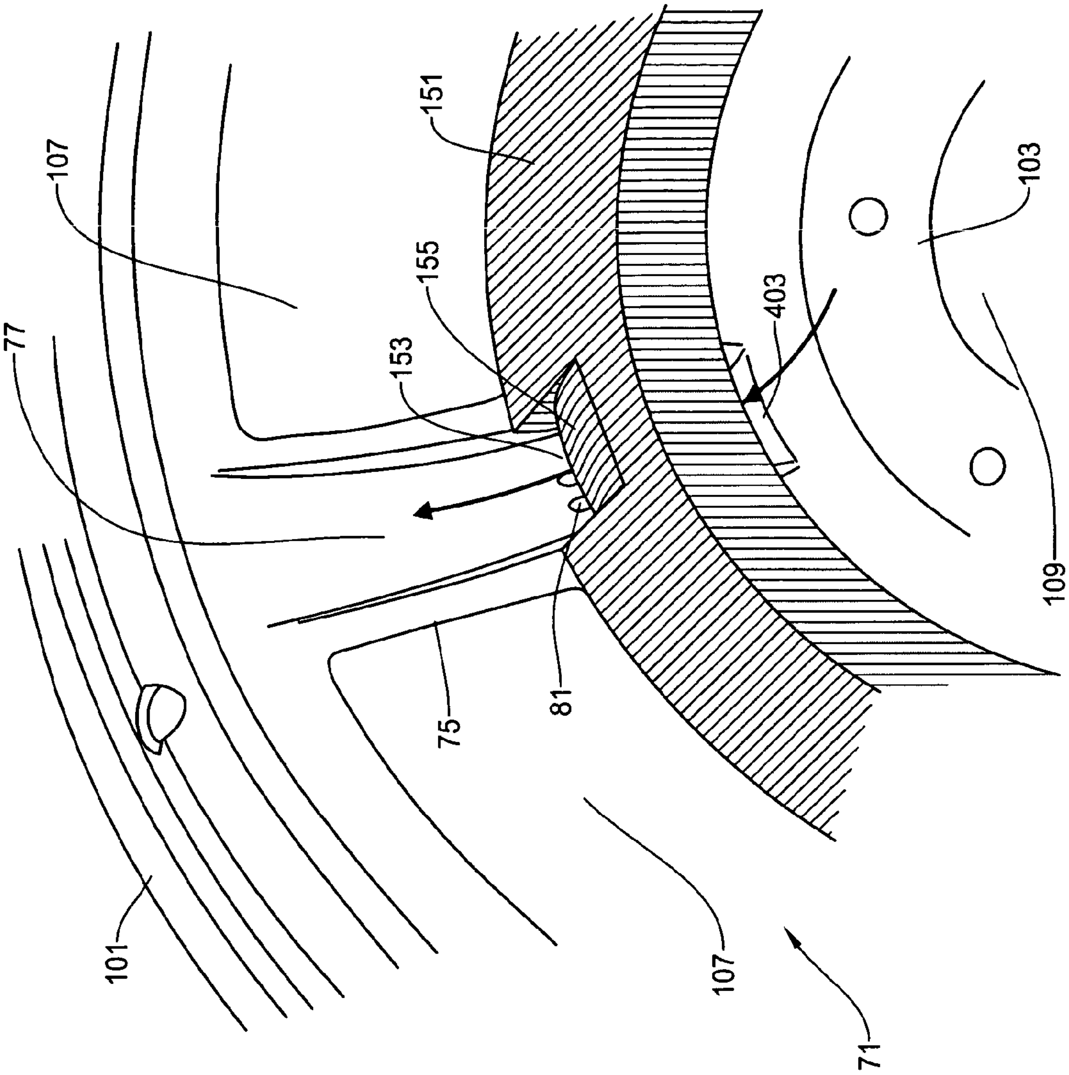
FIGS. 11A and 11B are perspective views similar to FIG. 10 except that the arrows are provided to indicate the flows of air when the loudspeaker is operated where
Figure 11B:
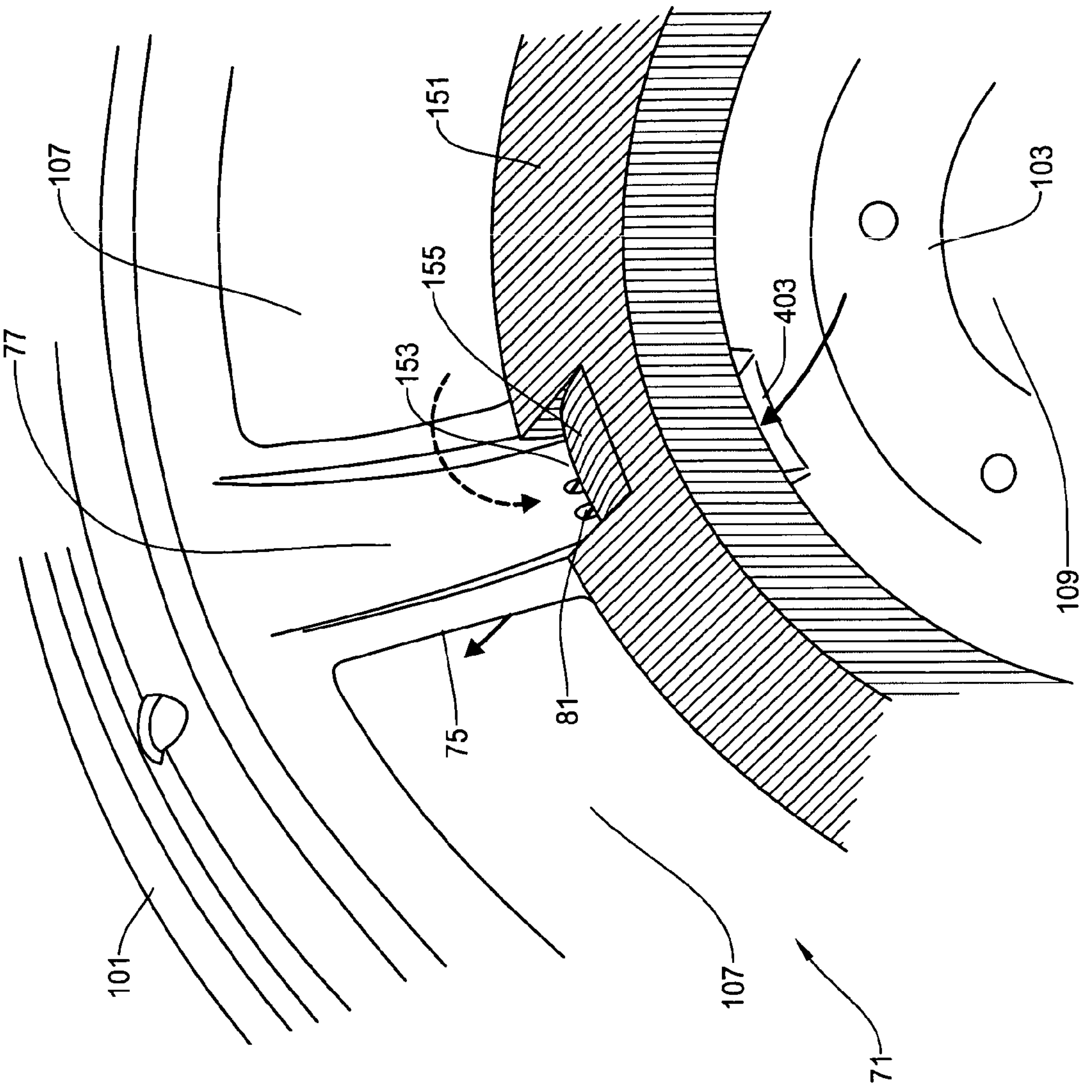

FIGS. 11A and 11B are perspective views similar to FIG. 10 except that the arrows are provided to indicate the flow of air in the speaker system 111. FIG. 11A shows the condition corresponding to that of FIGS. 3A and 4A where the diaphragm 117 makes the upward (outward) movement. The heated air around the voice coil 127 is attracted by the suction force produced by the upward movement and guided toward the upper region of the speaker through the air passage as indicated by the arrow. FIG. 1B shows the condition corresponding to that of FIGS. 3B and 4B where the diaphragm 117 makes the downward (inward) movement. The heated air around the voice coil 127 is compressed by the downward movement and exhausted to the outside through the ventilation slits 81 as indicated by the arrow.

In the situation of FIG. 11B, because the curved surface 155 on the cut-out 153 is abruptly curved (curve A in FIGS. 4A and 4B), the air in the upper region of the speaker cannot easily flow down through the air passage. This is because the air has to make abrupt changes in the direction along the curved surface 155 if it has to flow down through the air passage. Thus, the thermal management system of the present invention prohibits the air flow in the direction indicated by the dotted line arrow. Accordingly, in the case of FIG. 11B, the air flow through the air passage, from the lower opening to the outside through the ventilation slits 81, is not interfered by the reverse flow of the air.

Thus, by designing the air passage formed by the air guide 77 on the vented speaker frame 71 and the spider mounting ring 151 such that the air flow is facilitated in the predetermined directions in response to the movement of the diaphragm, effective ventilation is achieved for the speaker system. In other words, a directional air passage is created by the thermal management system of the present invention. Consequently, the thermal management system in the first embodiment of the present invention is able to efficiently cool the speaker system 111.

FIGS. 12-15B show second embodiment of the thermal management system utilizing the vented frame structure. FIG. 12 is a perspective view showing a vented speaker frame 401 and a heat sink ring 371 implementing the thermal management system of the present invention. The heat sink ring 371 has a heat transfer plate 374 which has a plurality of heat dissipation fins 375 arranged in the radial directions. The heat sink ring 371 also has a plurality of side heat sinks 381 formed on its outer surface 387. Each of the side heat sinks 381 has a plurality of heat dissipation fins arranged in the axial direction.

The vented speaker frame 401 functionally corresponds to the vented speaker frame 71 in the previous embodiment in that it has a plurality of air guides and ventilation slits. In this example, the frame structure 401 has a plurality of leg portions where receptacles 405 are formed thereon. The receptacles 405 functionally correspond to the frame legs 75 and the air guides 77 on the vented speaker frame 71 in the previous embodiment. Namely, in the second embodiment, the air guide and the ventilation slits are formed in each receptacle 405 of the vented speaker frame 401.

Figure 12A:
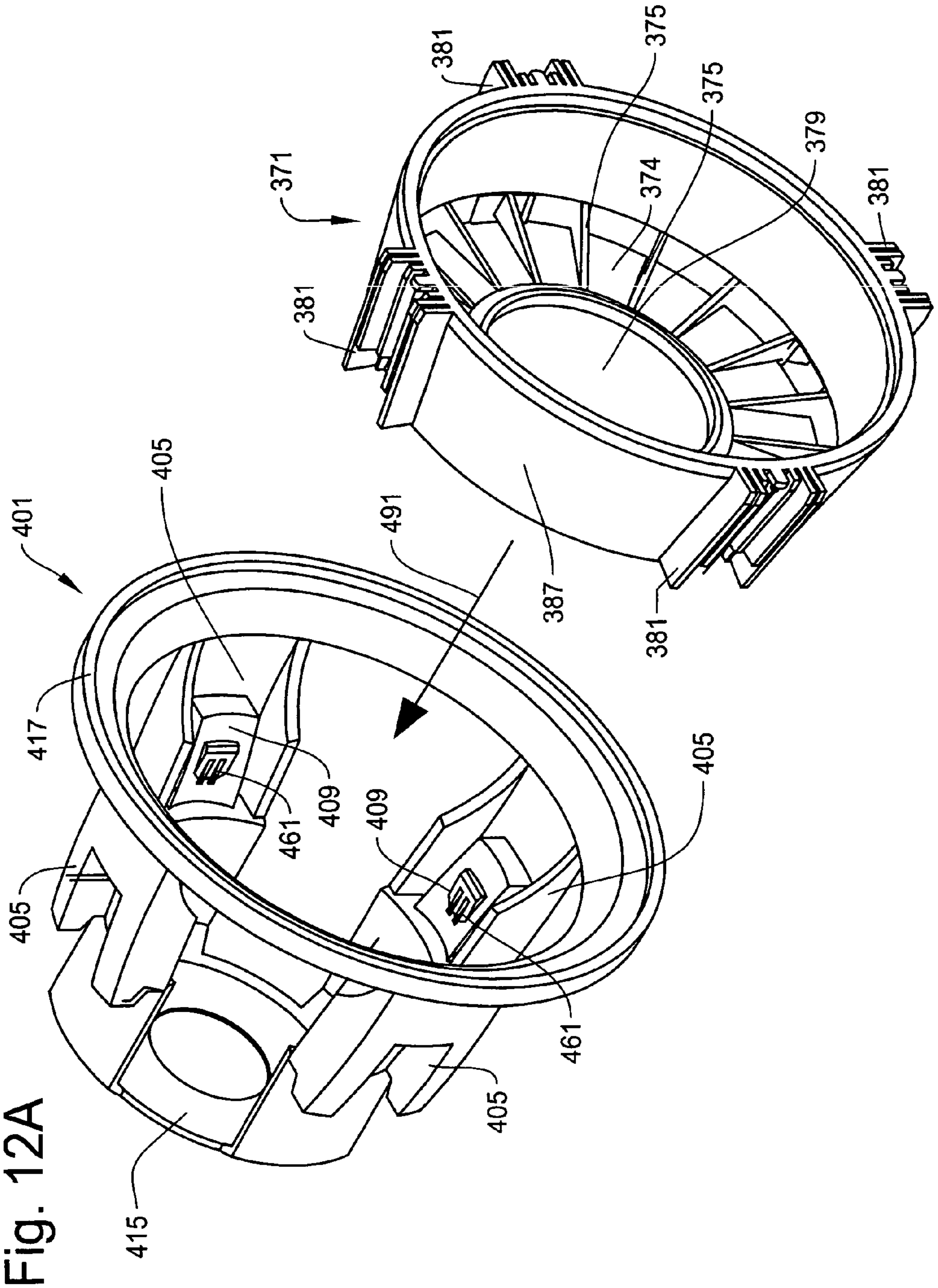
FIG. 12A is a perspective view of a speaker frame and a heat sink ring in the second embodiment of the thermal management system of the present invention.

The heat sink ring 371 is inserted in the frame structure 401 as indicated by the arrow 491 in FIG. 12A. The side heat sink 381 on the heat sink ring 371 and the receptacle 405 of the vented frame structure 401 are sized and configured such that each side heat sink 381 can fit in the corresponding receptacle 405. At the center of the heat sink ring 371, an opening 379 is formed for a space allowing the movements of the voice coil (not shown).

Figure 12B:
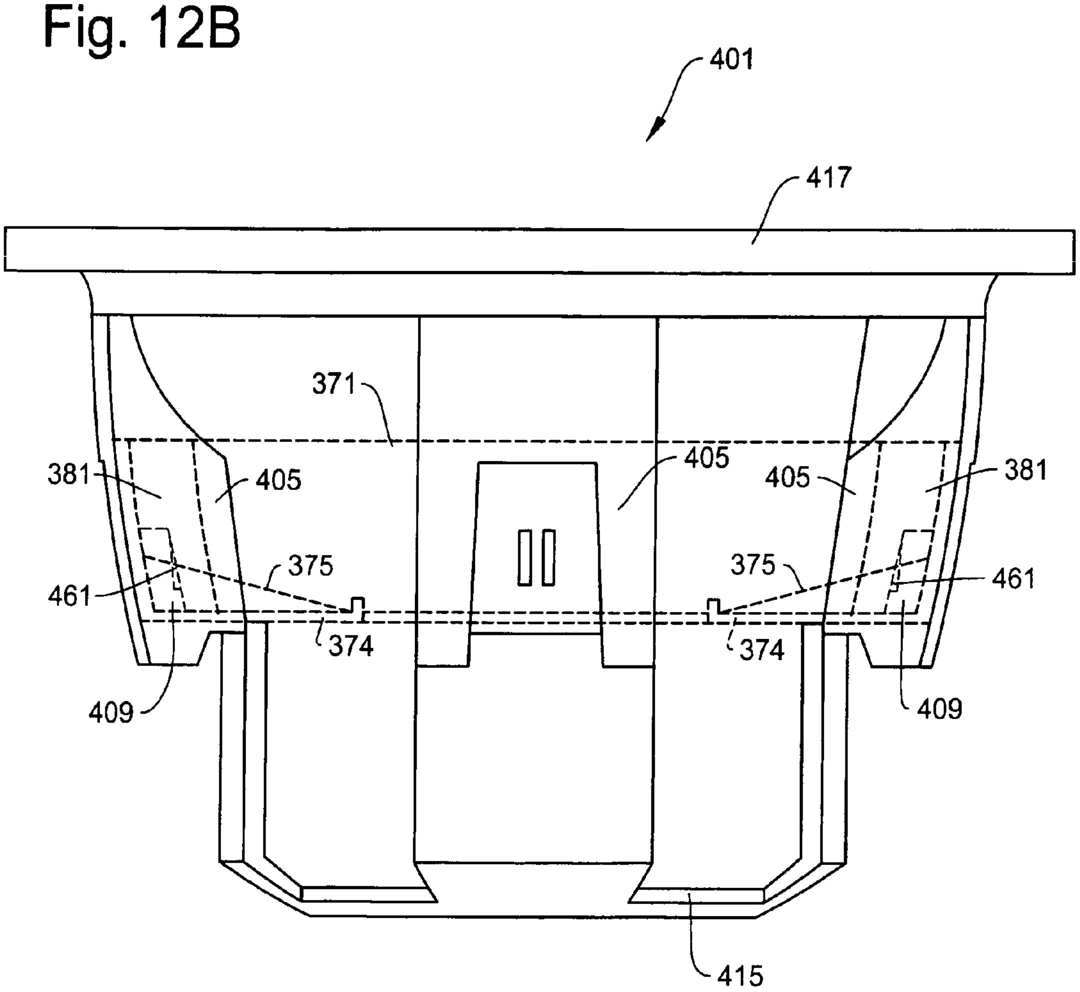
FIG. 12B is a cross sectional front view showing the speaker frame in which the heat sink ring is installed.

FIG. 12B is a front view showing the speaker system where the heat sink ring 371 is installed in the frame structure 401. In FIG. 12B, the heat sink ring 371 is illustrated by dotted lines. As shown, the side heat sink 381 of the heat sink ring 371 is inserted in the corresponding receptacle 405 of the vented speaker frame 401. The ventilation slits 461 formed on a step 409 in the receptacle 405 are also illustrated by the dotted lines.

Figure 13A:
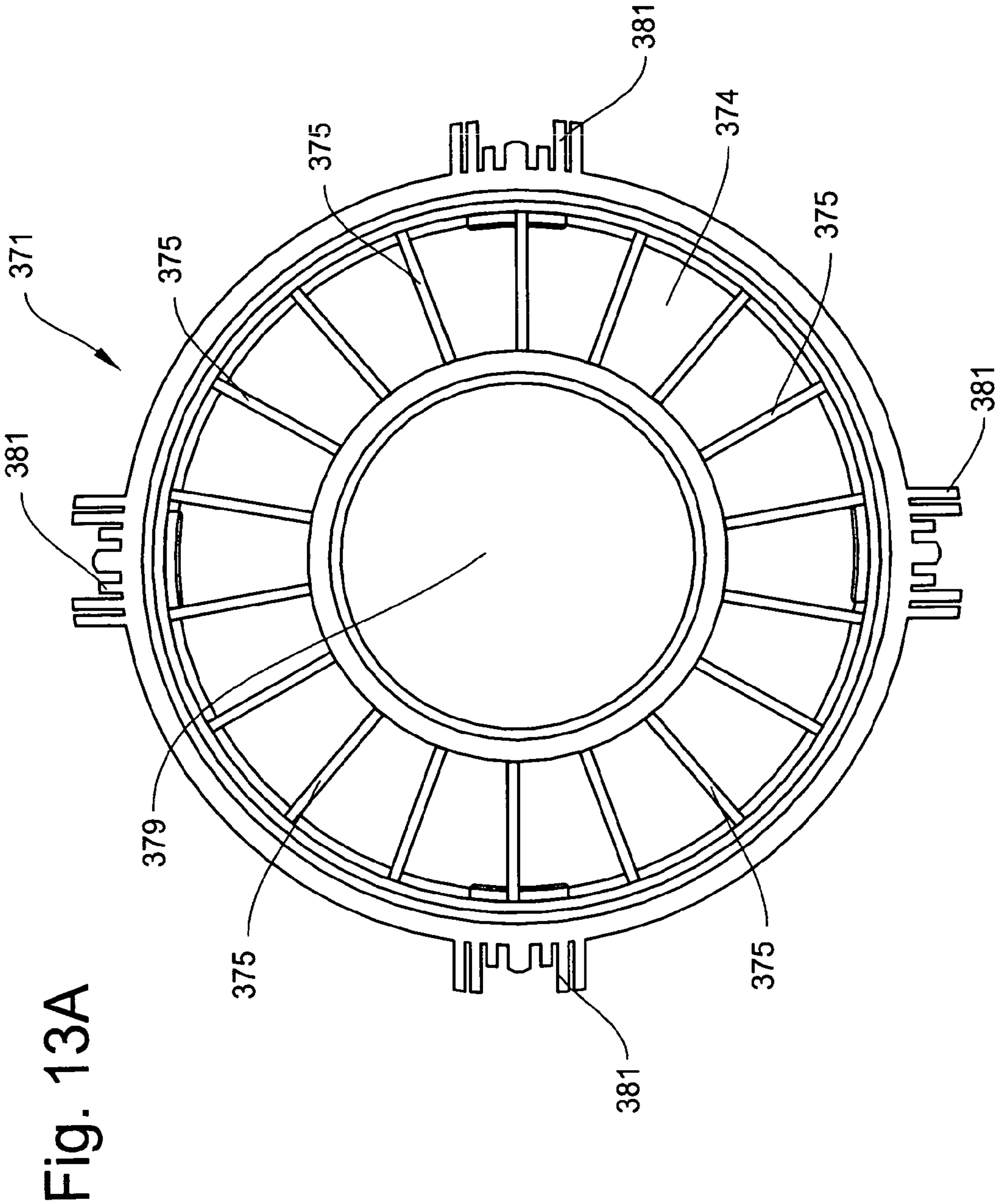
FIGS. 13A-13E show a structure of the heat sink ring in the second embodiment of the present invention where
Figure 13B:
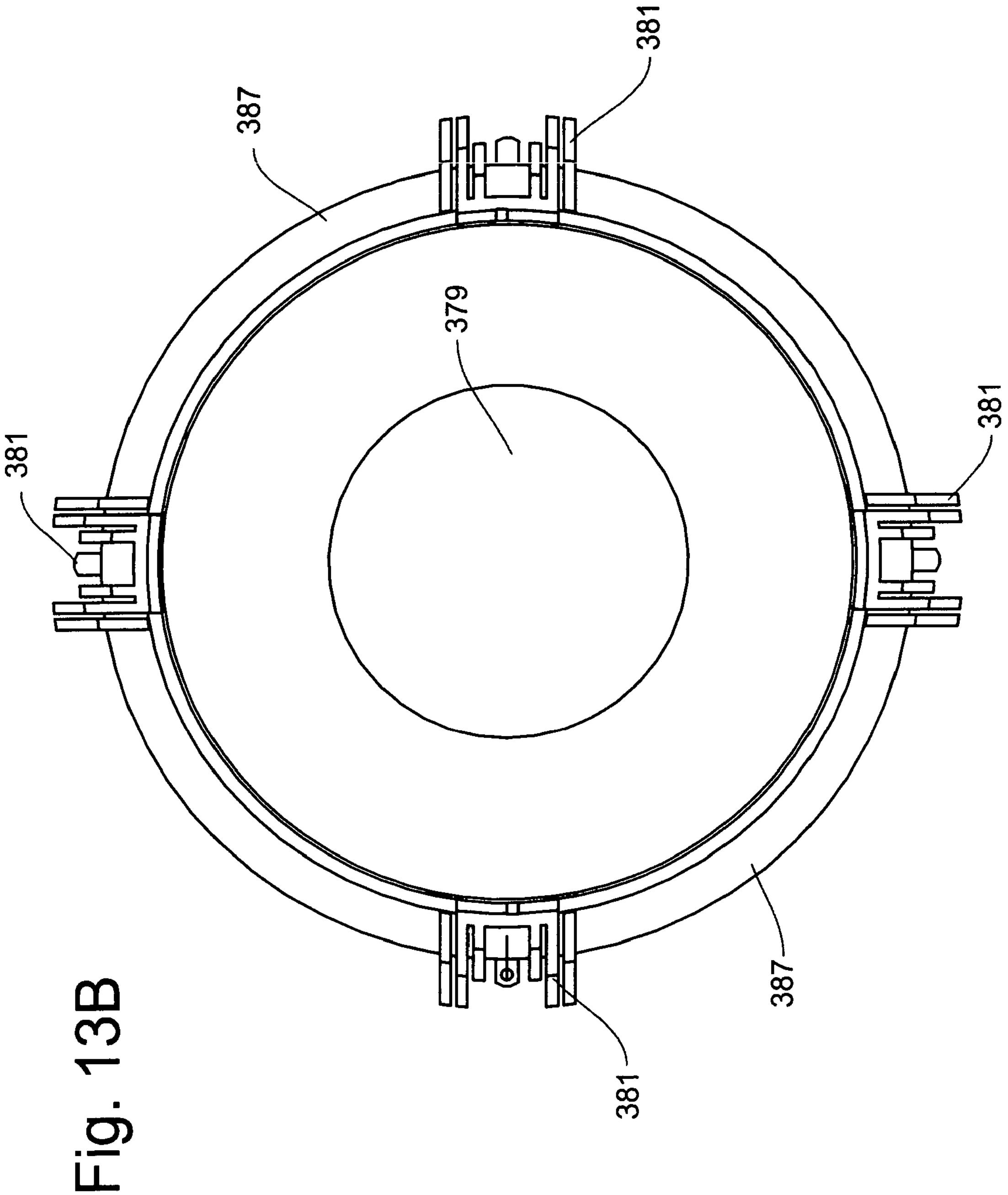
Figure 13C:
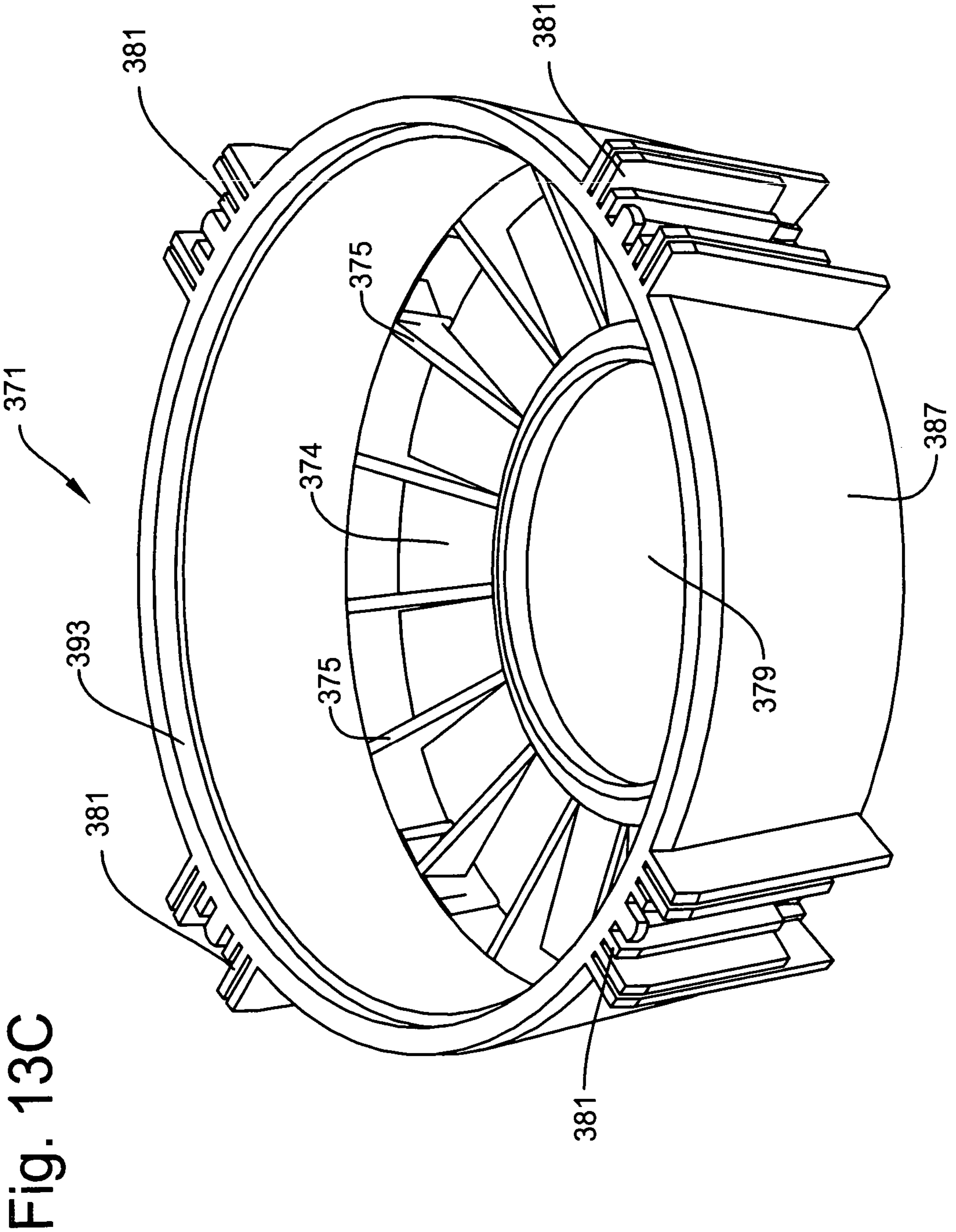

Next, with reference to FIGS. 13A-13C, the structure of the heat sink ring 371 is described in detail. FIG. 13A is a top view of the heat sink ring 371, FIG. 13B is a bottom view of the heat sink ring 371, and FIG. 13C is a perspective view showing an overall structure of the heat sink ring 371. As noted above, when assembled, the side heat sink 381 on the outer surface 387 of the heat sink ring 371 fits in the corresponding receptacle 405 formed on the vented speaker frame 401.

The heat sink ring 371 is substantially cylindrical and has the heat transfer plate 374 having a center opening. As noted above, the heat transfer plate 374 has a plurality of heat dissipation fins 375 radially aligned as shown in FIG. 13A. The heat dissipation fins 375 on the heat transfer plate 374 also function as air passages for prompting the air flow in the radial (horizontal) directions. Since the heat dissipation fins 375 are formed on the upper surface of the heat transfer plate 374, the bottom view of FIG. 13B does not show the heat dissipation fins 375.

As noted above, the heat sink ring 371 also has a plurality of side heat sinks 381 on the outer surface for dissipating heat by heat dissipation fins. The heat dissipation fins on the side heat sink 381 also function as air passages for prompting the air flow in the axial direction. As shown in FIG. 12B, since the heat sink ring 371 is mounted in the vented speaker frame 401 vertically, such air passages by the heat dissipation fins of the side heat sink 381 run in the vertical direction. The center opening 379 provides an adequate space for the voice coil for the reciprocal movements.

As shown by the perspective view of FIG. 13C, the diameter of the heat sink ring 371 is larger at the top than the bottom. In other words, the outer surface 387 of the heat sink ring 371 is slightly tapered to match the tapered inner wall of the vented speaker frame 401. The heat sink ring 371 may have an inner step 393 for attachment of a spider mounting ring similar to the one described with respect to the previous embodiment (FIGS. 9A-9C).

Figure 13D:
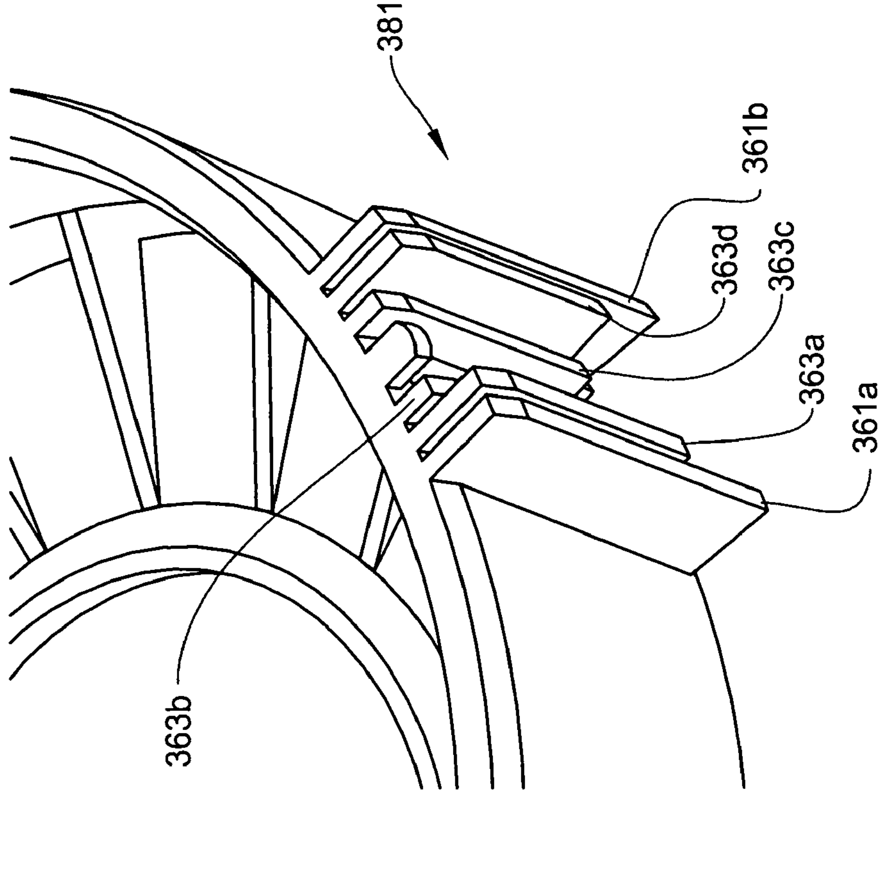
Figure 13E:
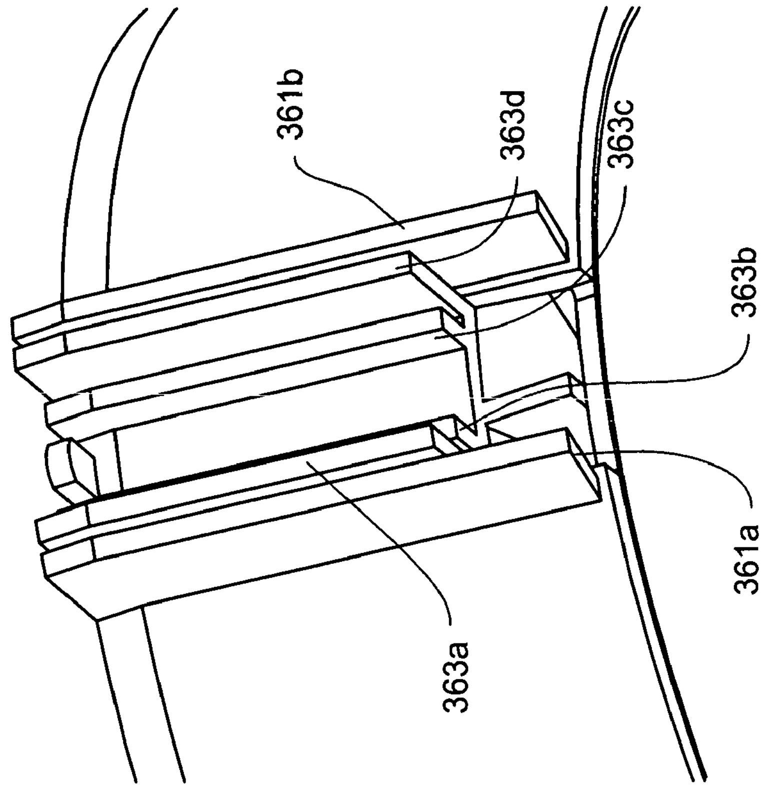

FIGS. 13D and 13E show more detailed views of the side heat sink 381 on the heat sink ring 371. The perspective view of FIG. 13D shows the structure of the side heat sink 381 as viewed from a slightly upper direction. The perspective view of FIG. 13E shows the structure of the side heat sink 381 as viewed from a slightly lower direction. As shown, the side heat sink 381 is comprised of a plurality of heat dissipation fins 361*a*-361*b* and 363*a*-363*d*. In this example, the outer fins 361*a* and 361*b* are longer than the inner fins 363*a*-363*d*. Because the heat dissipation fins 361*a*-361*b* and 363*a*-363*d* are arranged in parallel with one another, air passages are created between the two adjacent heat dissipation fins.

As shown in FIG. 13D, all the heat dissipation fins are flush with one another at the top, and therefore, there is no vertical difference at the top. However, as shown in FIG. 13E, the heat dissipation fins (outer fins) 361*a* and 361*b* extend further down than the heat dissipation fins (inner fins) 363*a*-363*d*). Thus, there is a vertical difference at the bottom. As will be described later, the position of the air passage is designed to match the step (protrusion) provided in the receptacle 405 of the vented speaker frame 401 when the heat sink ring 371 is inserted into the vented speaker frame 401.

Figure 14A:
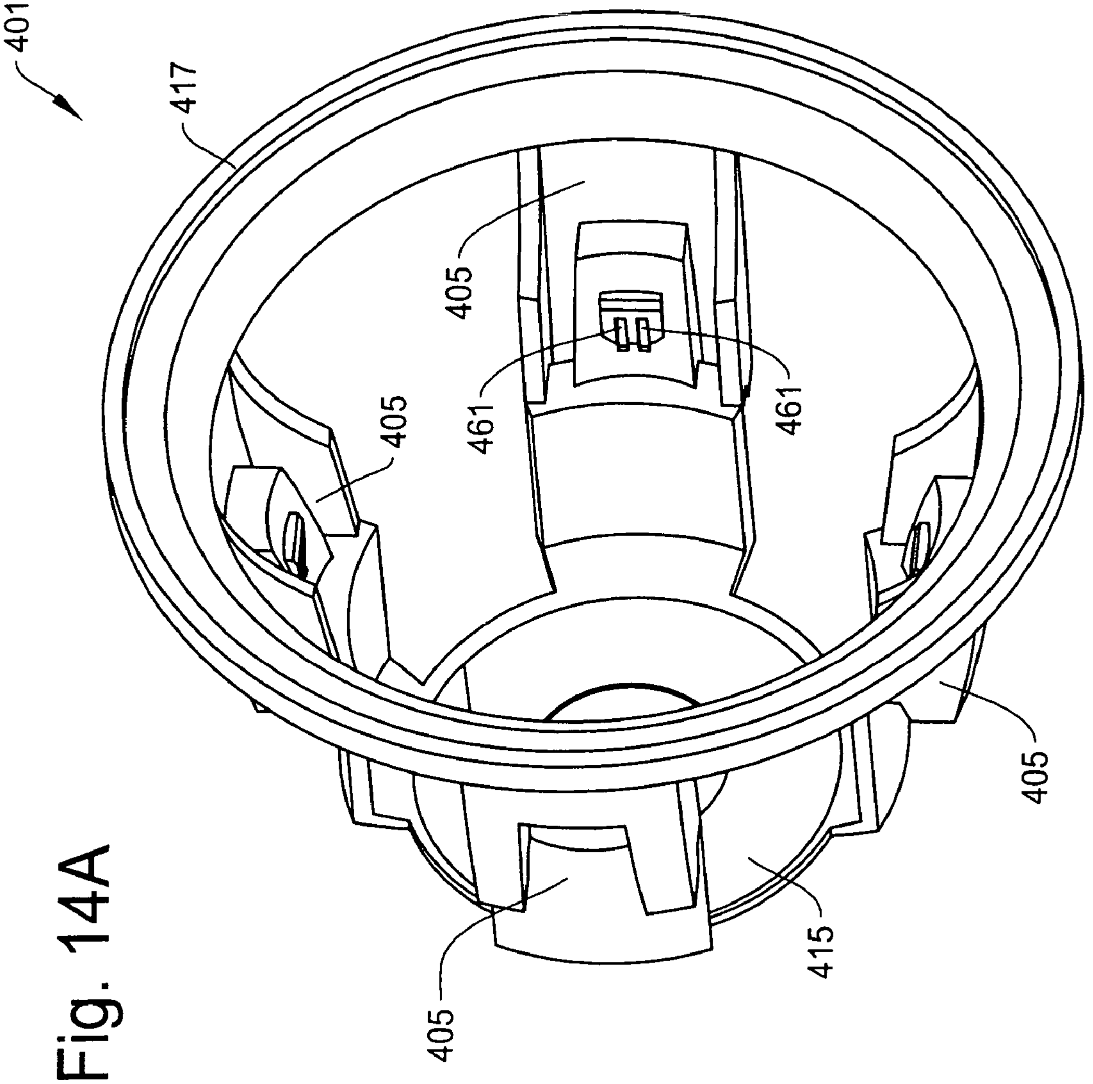
FIGS. 14A-14F show a structure of the speaker frame in the second embodiment of the present invention where FIG. 14A a perspective view showing an overall structure of the speaker frame.
Figure 14B:
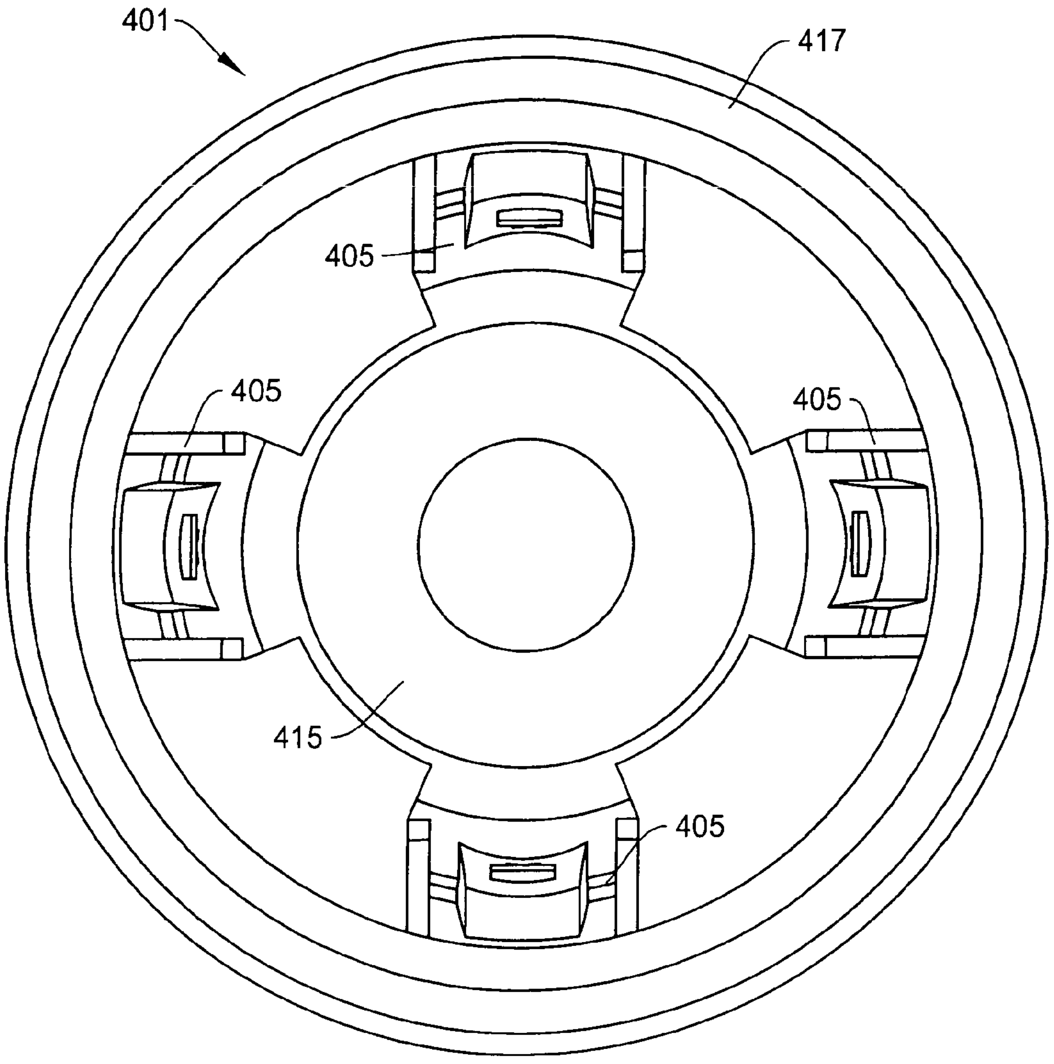
Figure 14C:
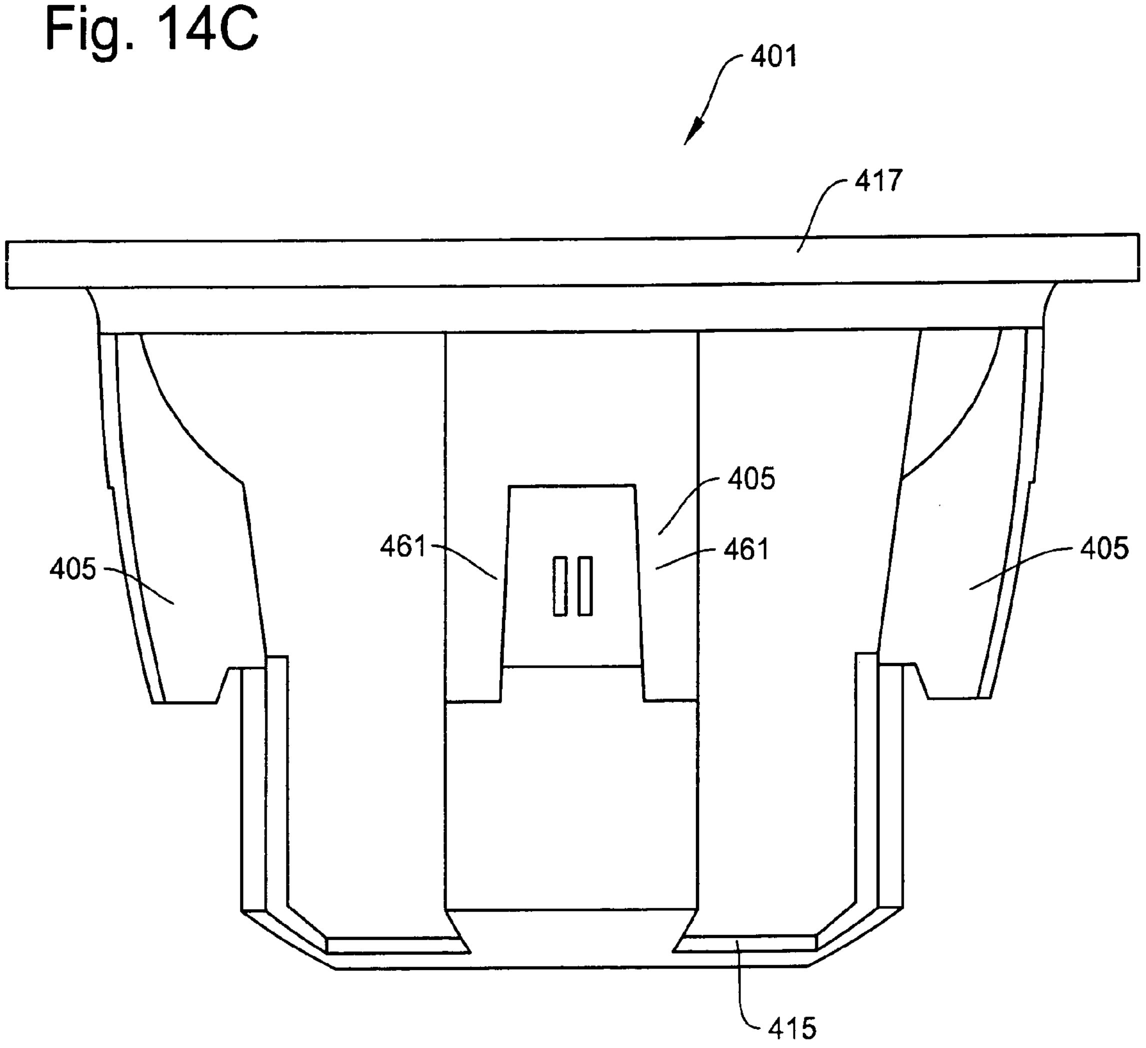
Figure 14D:
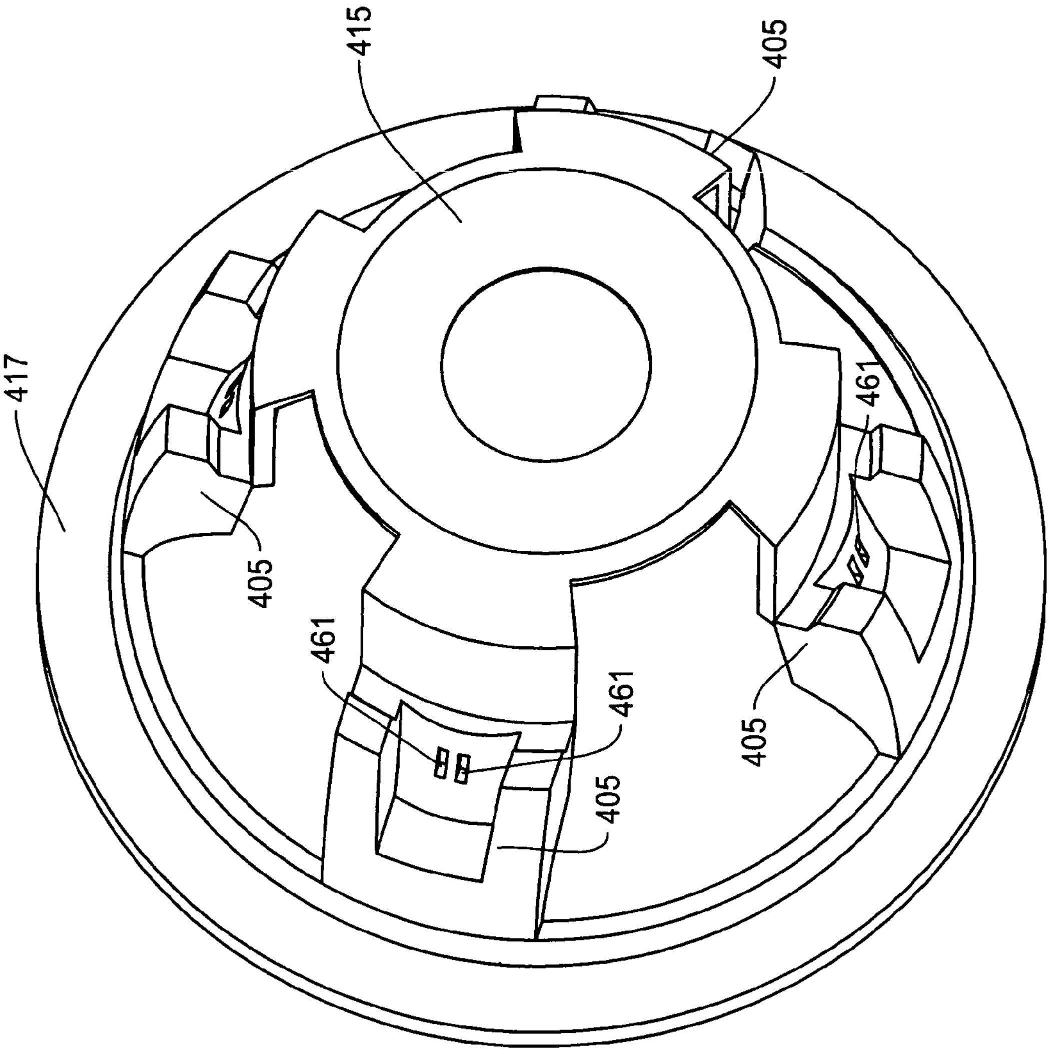

FIGS. 14A-14D show the structure of the vented speaker frame 401 in the second embodiment of the present invention where FIG. 14A is a perspective view showing an overall structure thereof, FIG. 14B is a top view thereof, FIG. 14C is a side view thereof, and FIG. 14D is a bottom perspective view thereof. The vented speaker frame 401 is mainly comprised of an upper ring 417, a plurality of frame legs each having a receptacle 405, and a base 415. Although not shown in the drawings, the diaphragm of the speaker is attached to the upper ring 417. At the center of the base 415, a circular opening is provided for air circulation through the pole piece (not shown) of the speaker system. In this example, the vented speaker frame 401 has four receptacles 405 each having a space for receiving the side heat sink 381 therein.

Figure 14E:
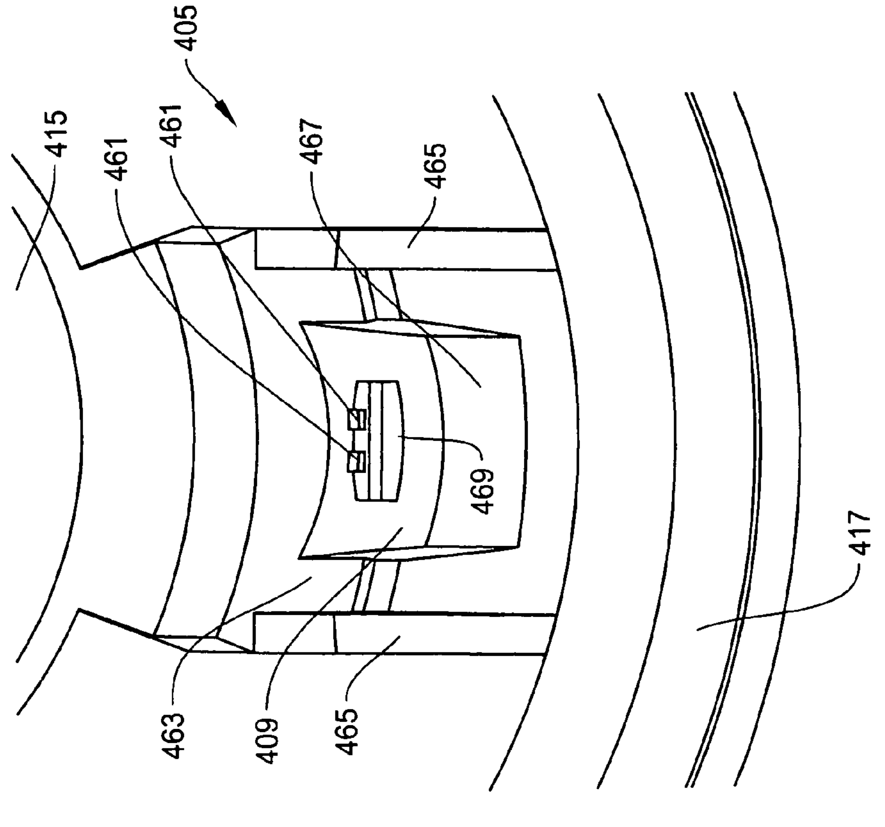
Figure 14F:
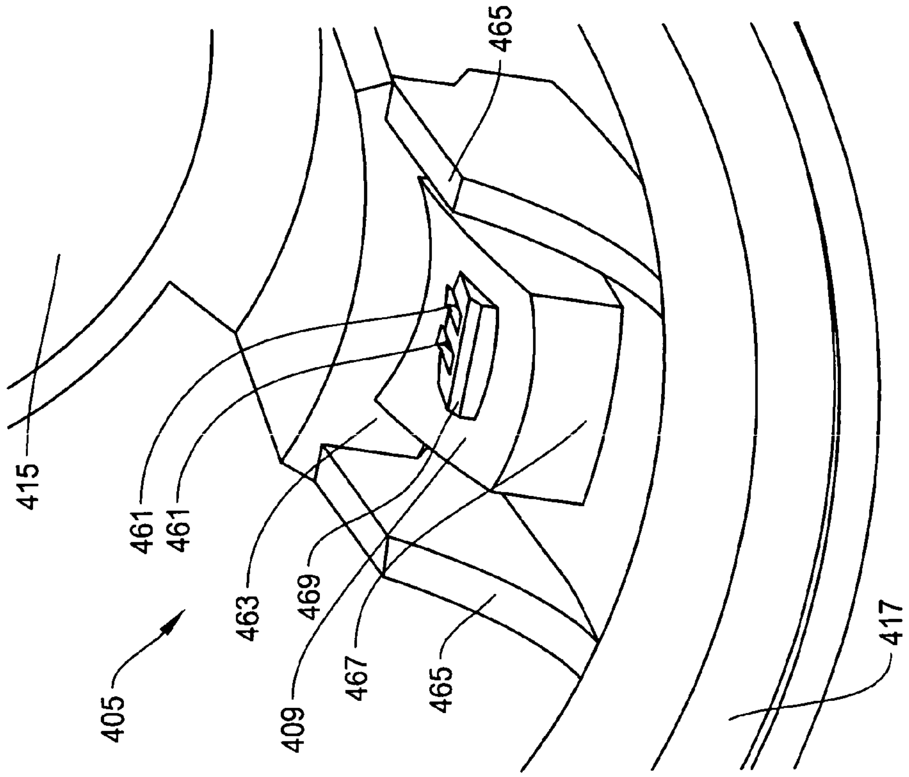

FIGS. 14E and 14F show the detailed structure of the receptacle 405 on the vented speaker frame 401. FIG. 14E provides a perspective view of the receptacle 405 as viewed from the upper front position. FIG. 14F is another perspective of the receptacle 405 as viewed from the upper right position. As shown in FIGS. 14E and 14F, the receptacle 405 is configured by a seat (bottom surface of the receptacle 405) 463, side walls 465 formed at both sides of the receptacle 405, and a step (protrusion) 409 formed in the lower end of the receptacle 405.

The step 409 has an upper surface 467 and a plurality of ventilation slits 461. The ventilation slits 461 penetrate through the receptacle 405 so that the heated inner air can flow toward the outside through the ventilation slits 461. A bulge portion 469 is created on the step 409 in the receptacle 405, and the ventilation holes 461 are formed on the bulge portion 469. As shown, the bulge portion 469 is smoothly and gently tapered at the lower part while it is sharply tapered at the upper part. The combination of the step 409, the ventilation slits 461 and the bulge portion 469 functions to control the air flow in the predetermined directions as will be described with reference to FIGS. 15A-15B.

The distance between the side walls 465 is designed to match the width of the side heat sink 381 shown in FIGS. 13D-13E to receive the side heat sink 381 therein. Further, the inner size and shape of the receptacle 405 is so designed that the bottom ends of the heat dissipation fins 361*a* and 361*b* contact the seat 463, i.e., the bottom surface of the receptacle 405, when the side heat sink 381 is inserted into the receptacle 405. Likewise, the inner size and shape of the receptacle 405 is so designed that the bottom ends of the heat dissipation fins 363*a*, 363*b*, 363*c*, 363*d* contact the upper surface of the step (protrusion) 409 when the side heat sink 381 is inserted in the receptacle 405.

Figure 15A:
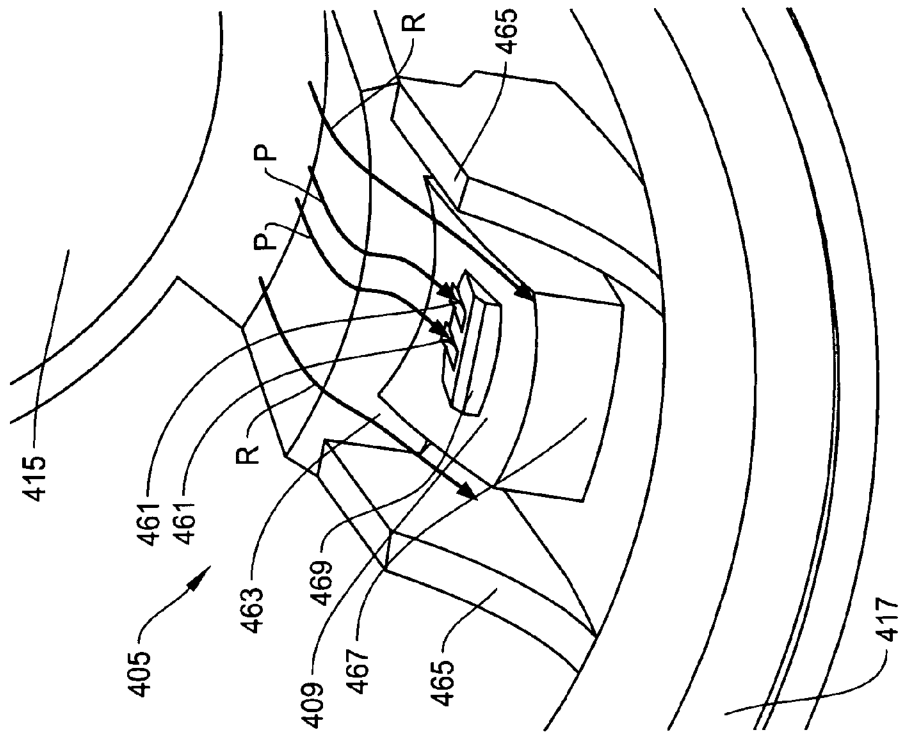
FIGS. 15A and 15B are perspective views similar to that of FIG. 14F except that arrows are provided to indicate the flows of air in relation to the ventilation slits formed on the speaker frame where
Figure 15B:
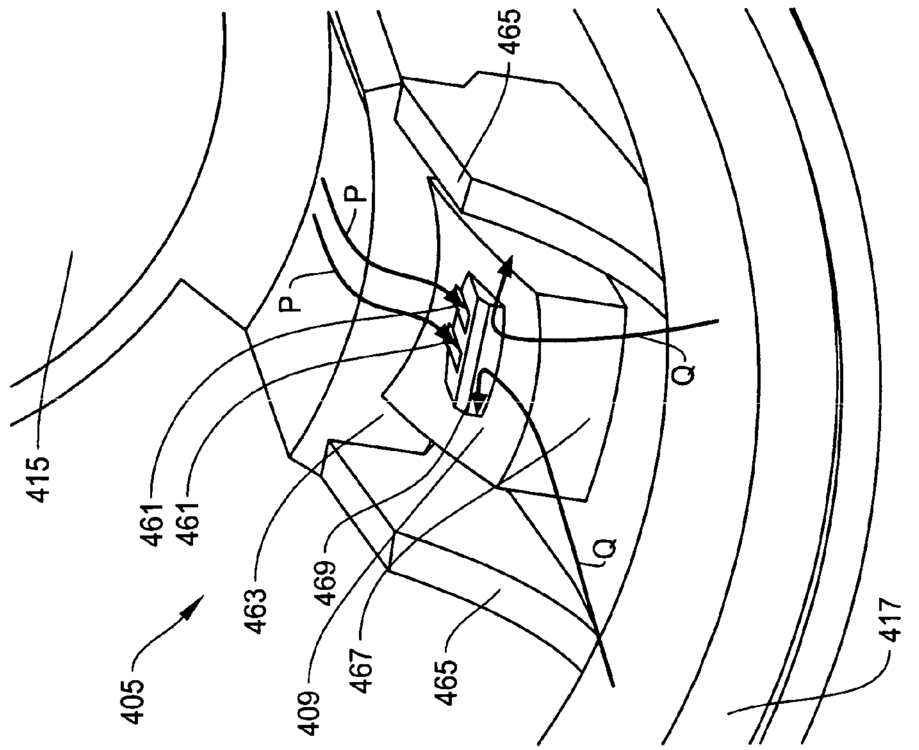

Reference is now made to FIGS. 15A and 15B showing perspective views similar to FIG. 14F except that arrows are provided to indicate the flows of air in relation to the ventilation slits 461. As noted above, the bulge portion 469 is created on the protrusion 409 in the receptacle 405. As noted above, the bulge portion 469 on the step 409 is smoothly and gently tapered at the lower part while it is abruptly tapered at the upper part. In other words, the bulge portion 469 has a small taper angle at the lower part and a large taper angle at the upper part. The difference of such taper angle of the bulge portion 469 controls the flow direction of the air.

FIG. 15A shows the condition where the diaphragm (not shown) makes the upward (outward) movement similar to the condition shown in FIGS. 3A and 4A. Because the space in the upper region of the speaker system expands, the heated air from the voice coil area is attracted toward the upper direction. Since the opening of the ventilation slits 461 is relatively large, the heated air flows toward the outside through the ventilation slits 461 as indicated by arrows P. Further, the air flows smoothly toward the ventilation slits 461 because the lower part of the bulge portion 469 is gently tapered so that air flow is not interfered by the bulge portion 469. The other heated air flows toward the upper region of the speaker as indicated by arrows R where it is cooled by the heat dissipation fins 361*a*-361*b* and 363*a*-363*d* of the side heat sink 381.

FIG. 15B shows the condition where the diaphragm makes the downward (inward) movement similar to the condition shown in FIGS. 3B and 4B. In this condition, the inner space of the speaker system is compressed, thus, the heated air from the voice coil area is forced to flow upward and is exhausted to the outside through the ventilation slits 461 as indicated by arrows P. Similar to the situation of FIG. 15A, the air flow is efficiently conducted because the bulge portion 469 at the lower part has the small taper angle.

In contrast, the downward air flow from the upper region of the speaker is restricted by the upper part of the bulge portion 469 having a large taper angle as indicated by arrows Q. Thus, the upward flow of the heated air is not interfered by the downward flow of the air and can smoothly go outside of the speaker system through the ventilation slits 461. In other words, a directional air passage is created by the thermal management system of the present invention. Consequently, the thermal management system in the first embodiment of the present invention is able to efficiently cool the speaker system.

As has been described above, according to the present invention, the thermal management system is configured to effectively control the directions of air flow so that the heated inner air can be smoothly transferred to a cooler area of the speaker or outside of the speaker. The thermal management system facilitates smooth air flow in predetermined directions in response to reciprocal movements of the speaker. Thus, the thermal management system of the present invention promotes the cooling effects of the speaker by efficiently circulating the air between the inner area and the outer area of the loudspeaker while minimizing distortions of sound.

Although the invention is described herein with reference to the preferred embodiment, one skilled in the art will readily appreciate that various modifications and variations may be made without departing from the spirit and scope of the present invention. Such modifications and variations are considered to be within the purview and scope of the appended claims and their equivalents.

What is claimed is:

1. A thermal management system for a speaker system, comprising:

a speaker frame for mounting a diaphragm of the speaker system at its upper side, and a voice coil and a magnetic circuit of the speaker system at its lower side;

an air guide formed on the speaker frame for guiding air, the air guide being oriented generally in a direction between the upper side and the lower side of the speaker frame;

a ventilation slit formed on the air guide which penetrates through the speaker frame for air communication; and a spider mounting ring for mounting a spider of the speaker system on the speaker frame, the spider mounting ring having a cut-out at its upper edge which positionally match the air guide when attached to the speaker frame;

wherein the cut-out of the spider mounting ring is curved sharply at its upper surface and a lower edge of the spider mounting ring is gently curved in a manner substantially parallel with an inner surface of the air guide, thereby creating an air passage of directional property.

2. A thermal management system as defined in claim 1, wherein the speaker frame has a plurality of leg portions and the air guide is formed at a predetermined position of each of the leg portions, and wherein a plurality of the cut-outs of the spider mounting ring are positionally matched with the corresponding air guides.

3. A thermal management system as defined in claim 1, wherein the air guide on the speaker frame has side walls on the inner surface, thereby creating an indented structure for guiding the air therethrough.

4. A thermal management system as defined in claim 1, wherein the ventilation slit is configured by one or more through holes formed on each air guide on the speaker frame to communicate the air between inside and outside of the speaker system.

5. A thermal management system as defined in claim 1, wherein the speaker frame has a plurality of openings for air circulation at the upper side.

6. A thermal management system as defined in claim 5, wherein the air from the lower side of the speaker system flows through the air passage toward the upper side of the speaker system and comes outside of the speaker system through the openings when the diaphragm makes an upward movement.

7. A thermal management system as defined in claim 5, wherein the air from the lower side of the speaker system flows through the air passage and comes outside of the speaker system through the ventilation slits on the air guides when the diaphragm makes a downward movement.

8. A thermal management system as defined in claim 7, wherein the upper surface of the cut-out of the spider mounting ring which is sharply curved prohibits the air from the upper side of the speaker system from flowing downwardly through the air passage when the diaphragm makes the downward movement, thereby avoiding interference with the flow of air from the lower side to the outside through the air passage and the ventilation slits.

* * * * *